(12) United States Patent
Kim et al.

(10) Patent No.: US 7,148,527 B2
(45) Date of Patent: Dec. 12, 2006

(54) SEMICONDUCTOR DEVICES WITH ENLARGED RECESSED GATE ELECTRODES

(75) Inventors: Seong-Ho Kim, Gyeonggi-do (KR); Chang-Sub Lee, Gyeonggi-do (KR); Jeong-Dong Choe, Gyeonggi-do (KR); Sung-Min Kim, Incheon Metropolitan (KR); Shin-Ae Lee, Gyeonggi-do (KR); Dong-Gun Park, Gyeonggi-do (KR)

(73) Assignee: Samsung Electronics Co., Ltd. (KR)

( * ) Notice: Subject to any disclaimer, the term of this patent is extended or adjusted under 35 U.S.C. 154(b) by 40 days.

(21) Appl. No.: 10/738,316

(22) Filed: Dec. 17, 2003

(65) Prior Publication Data

US 2004/0129959 A1 Jul. 8, 2004

(30) Foreign Application Priority Data

Dec. 18, 2002 (KR) ........................ 10-2002-0081091

(51) Int. Cl.
*H01L 29/76* (2006.01)
(52) U.S. Cl. ....................................... 257/288; 257/330
(58) Field of Classification Search ................ 257/288, 257/330–334
See application file for complete search history.

(56) References Cited

U.S. PATENT DOCUMENTS 5,021,355 A * 6/1991 Dhong et al. ............... 438/270
5,985,126 A 11/1999 Bleck et al.
6,255,202 B1 * 7/2001 Lyons et al. ................ 438/585
6,303,448 B1 10/2001 Chang et al.
6,319,777 B1 * 11/2001 Hueting et al. ............. 438/270
6,642,130 B1 * 11/2003 Park .......................... 438/589

FOREIGN PATENT DOCUMENTS

| JP | 04-093080 | 3/1992 |
| KR | 1020000019080 A | 4/2000 |
| KR | 1020010064328 A | 7/2001 |

OTHER PUBLICATIONS

Notice to File a Response/Amendment to the Examination Report, Korean Application No. 10-2002-0081091, Nov. 22, 2004.

* cited by examiner

*Primary Examiner*—Tuan H. Nguyen
(74) *Attorney, Agent, or Firm*—Myers Bigel Sibley & Sajovec

(57) ABSTRACT

A semiconductor device includes a semiconductor substrate having a recess therein. A gate insulator is disposed on the substrate in the recess. The device further includes a gate electrode including a first portion on the gate insulator in the recess and a second reduced-width portion extending from the first portion. A source/drain region is disposed in the substrate adjacent the recess. The recess may have a curved shape, e.g., may have hemispherical or ellipsoid shape. The source/drain region may include a lighter-doped portion adjoining the recess. Relate fabrication methods are also discussed.

19 Claims, 22 Drawing Sheets

SEMICONDUCTOR DEVICES WITH ENLARGED RECESSED GATE ELECTRODES

RELATED APPLICATION

This application claims the benefit of Korean Patent Application No. 10-2002-0081091, filed on Dec. 18, 2002, which is incorporated herein in its entirety by reference.

BACKGROUND OF THE INVENTION

The present invention relates to semiconductor devices and methods of fabrication therefor, and more particularly, semiconductor devices with recessed gate electrode portions and methods for forming the same.

An integrated circuit (IC) may include several metal oxide semiconductor (MOS) transistors. As ICs become more highly integrated, the scale of such MOS transistors may decrease. Therefore, there is a need for reducing problems arising from short channel effects for such small-scale MOS transistors.

A gate of a MOS transistor may be formed by a method wherein a gate insulator is formed on a semiconductor substrate and then a gate conductive layer is formed on the gate insulator and patterned. Source/drain regions may be formed by performing ion-implantation process after forming the gate electrode.

However, the gate formed by a conventional patterning process may have etch damage on sidewalls thereof, so that charge may inconstantly flow from the channel to the periphery of the gate and leakage of current may occur. Additionally, conventional methods may not be capable of forming a gate electrode having a shorter channel length than a resolution of a photolithography process. This may serve as a limit on operation speed and power consumption characteristics.

In order to solve problems due to etch damage and to improve characteristics of a semiconductor device, a T-shaped gate electrode formed by a damascene process has been introduced as shown, for example, in U.S. Pat. No. 6,255,202.

FIGS. 1 through 4 are cross-sectional views showing a conventional method for forming a T-shaped gate electrode. Referring to FIG. 1, an oxide layer 13 and a nitride layer 15 are sequentially formed on a semiconductor substrate 11. The nitride layer 15 is patterned using a photolithography process, thereby forming an initial groove 17 exposing the oxide layer 13. Referring to FIG. 2, spacers 19 are formed on sidewalls of the initial groove 17. The exposed oxide layer 13 is patterned using the spacers 19 as etch masks, thereby exposing the semiconductor substrate 11.

Referring to FIG. 3, the spacers 19 are removed to form a final groove 21. A gate oxide layer 23 is formed on the exposed semiconductor substrate 11, and the final groove 21 is filled with a conductive material, thereby forming a T-shaped gate electrode 25. Although not illustrated, the nitride layer 15 is removed and an ion-implantation process is performed to form source/drain regions (not shown) in a subsequent process.

In order to reduce problems arising from a short channel effect, source/drain regions are typically formed very shallowly. However, as semiconductor devices become increasingly highly integrated, it is generally more difficult to form source/drain regions very shallowly in a process of forming a T-shaped gate or a conventional gate. To address these problems, a process of forming a recessed gate electrode portion (or an elevated source/drain) has been introduced, as described, for example, in U.S. Pat. No. 6,303,448, which discloses a process for forming a recessed gate electrode portion (or an elevated source/drain).

FIGS. 5 through 7 are cross-sectional views showing a conventional method of forming a recessed gate electrode portion. Referring to FIG. 5, an oxide layer 53 and a nitride layer 55 are sequentially formed on a semiconductor substrate 51. The nitride layer 55, the oxide layer 53 and a part of the semiconductor substrate 51 are anisotropically dry-etched to form a groove 57. Referring to FIG. 6, a gate insulator 63 is formed on the surface of the etched semiconductor substrate 51 by a thermal oxidation process. Referring to FIG. 7, the groove 57 is filled with a conductive material, thereby forming a recessed gate electrode portion 65. Although not illustrated, the nitride layer 55 is removed and an ion-implantation process is performed to form source/drain regions in a subsequent process.

The conventional methods described above may have several problems. According to a conventional process of forming a T-shaped gate electrode, it may be difficult to form source/drain regions with shallow junctions. This may be because the channel typically is formed around a surface of a semiconductor substrate like a conventional gate process. Also, drain-induced barrier lowering DIBL may occur, which may cause a leakage current between the semiconductor substrate and a gate insulator at a lower voltage than a threshold voltage.

According to some conventional processes of forming a recessed gate electrode portion, a capacitance of a parasitic capacitor is increased due to overlap of gate electrode and source/drain. This is because the semiconductor substrate is partially etched to enlarge a contact area between the gate electrode and the semiconductor substrate and also a gate insulator of a thermal oxide is thinly conformally formed along an inner wall of a groove formed on the semiconductor substrate. Gate-induced drain leakage (GIDL) may be increased in a device fabricated in such a manner.

SUMMARY OF THE INVENTION

According to some embodiments of the present invention, a semiconductor device includes a semiconductor substrate having a recess therein. A gate insulator is disposed on the substrate in the recess. The device further includes a gate electrode including a first portion on the gate insulator in the recess and a second reduced-width portion extending from the first portion. A source/drain region is disposed in the substrate adjacent the recess. The recess may have a curved shape, e.g., may have a hemispherical or semielliptical shape. The source/drain region may include a lighter-doped portion adjoining the recess.

In some embodiments, the gate insulator comprises a first portion disposed on a sidewall of the recess and having a first thickness, and a second portion disposed on a bottom of the recess and having a second thickness less than the first thickness. The first portion of the gate insulator may adjoin a source/drain region in the substrate.

In further embodiments of the present invention, the device further includes an insulation layer on a surface of the substrate adjoining the second portion of the gate electrode above the substrate and extending over a portion of the first portion of the gate electrode. An insulating spacer is disposed on a sidewall of the second portion of the gate electrode and on the insulation layer.

In further embodiments of the present invention, the gate electrode further comprises a third portion on the second portion, the third portion having a greater width than the second portion. An insulation layer on a surface of the substrate may adjoin the second portion of the gate electrode above the substrate and extend over a portion of the first portion of the gate electrode, and an insulating spacer may be disposed on a sidewall of the second portion of the gate electrode, on a sidewall of the third portion of the gate electrode and on the insulation layer. In some embodiments, the gate insulator may include a first portion disposed on a sidewall of the recess and having a first thickness, and a second portion disposed on a bottom of the recess and having a second thickness less than the first thickness. In other embodiments, the gate insulator comprises a substantially uniform thickness insulation layer lining the recess.

In some method embodiments of the present invention, a semiconductor device is formed. An insulation layer is formed on a substrate, and a sacrificial layer is formed on the insulation layer. An opening through the sacrificial layer and the insulation layer is formed to expose an active region of the substrate. A portion of the active region is removed to form a recess (e.g., having a hemispherical, semielliptical or other curved shape) therein that has a greater width than the opening through the sacrificial layer and the insulation layer. A gate insulator is formed in the recess and a gate electrode is formed extending through the sacrificial layer and the insulation layer and into the recess. The gate electrode includes a first portion on the gate insulator in the recess and a second reduced-width portion extending from the first portion. The sacrificial layer is removed to expose a sidewall of the gate electrode outside of the recess, and an insulating spacer is formed on the exposed sidewall of the gate electrode. A source/drain region is formed in the substrate adjacent the recess.

DETAILED DESCRIPTION

Figure 1:
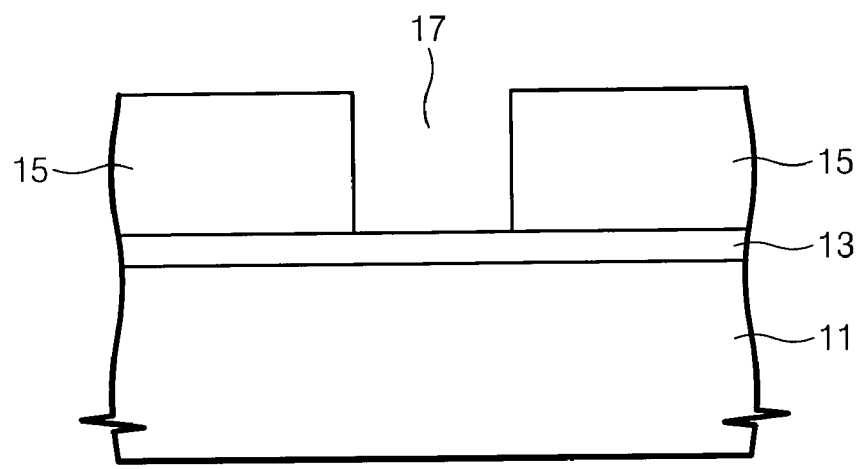
FIGS. 1 through 4 are cross-sectional views showing a conventional method of forming a T-shaped gate electrode.
Figure 2:
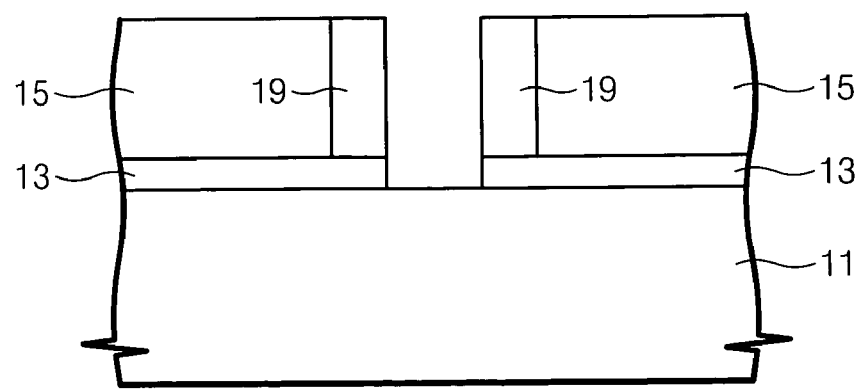
Figure 3:
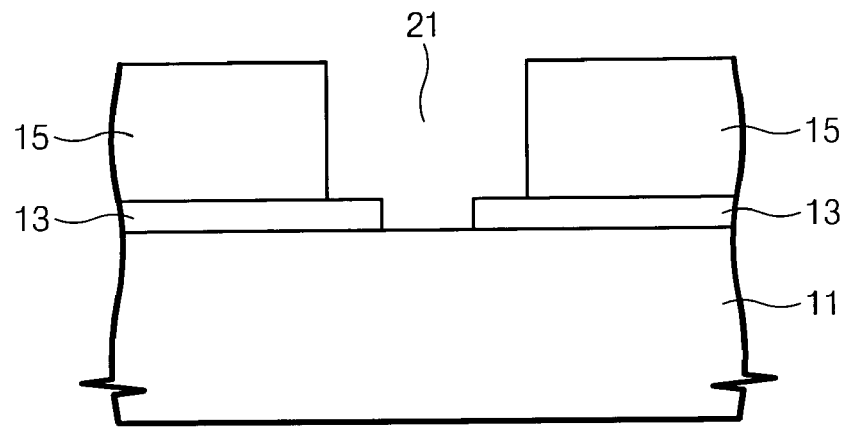
Figure 4:
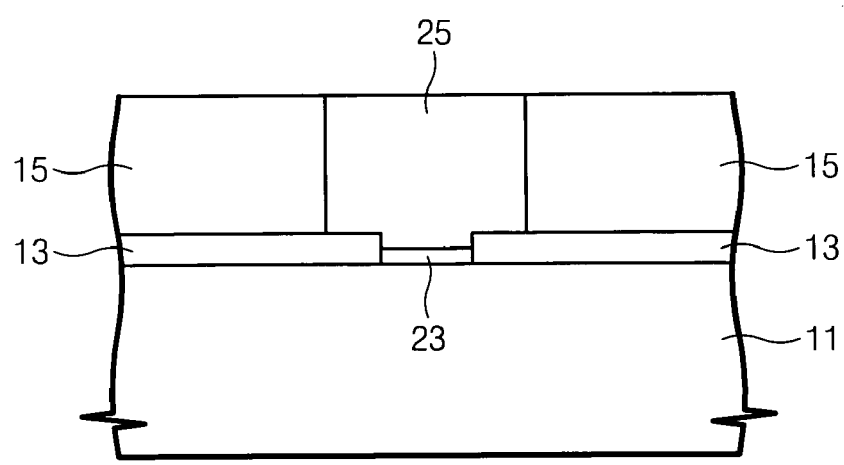
Figure 5:
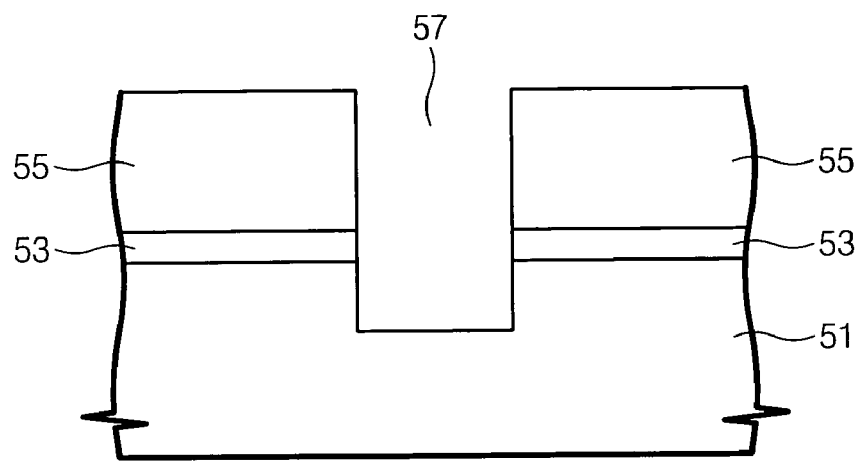
FIGS. 5 through 7 are cross-sectional views showing a conventional method of forming a recessed gate electrode portion.
Figure 6:
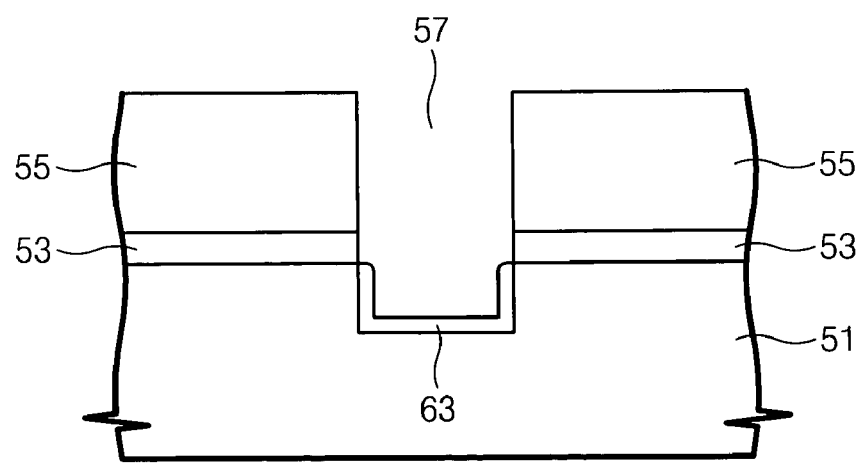
Figure 7:
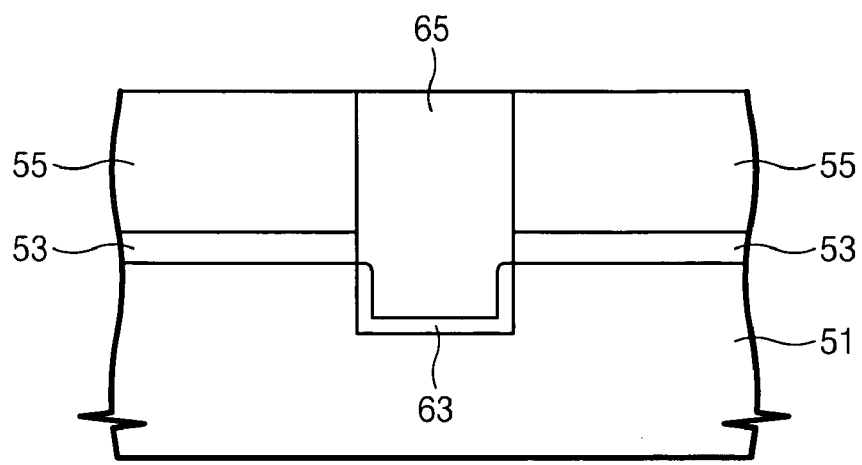

The present invention will now be described more fully hereinafter with reference to the accompanying drawings, in which preferred embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. In the drawings, the thickness of layers and regions are exaggerated for clarity. It will be understood that when an element such as a layer, region or substrate is referred to as being "on" another element, it can be directly on the other element or intervening elements may also be present. Furthermore, relative terms, such as "beneath," may be used herein to describe one element's relationship to another element as illustrated in the Figures. It will be understood that relative terms are intended to encompass different orientations of the device in addition to the orientation depicted in the figures. For example, if a device in the figures is turned over, elements described as "below" other elements would then be oriented "above" the other elements. The exemplary term "below," therefore, encompasses both an orientation of above and below.

It will be understood that although the terms first and second are used herein to describe various regions, layers and/or sections, these regions, layers and/or sections should not be limited by these terms. These terms are only used to distinguish one region, layer or section from another region, layer or section. Thus, a first region, layer or section discussed below could be termed a second region, layer or section, and similarly, a second without departing from the teachings of the present invention. Like numbers refer to like elements throughout.

Figure 8:
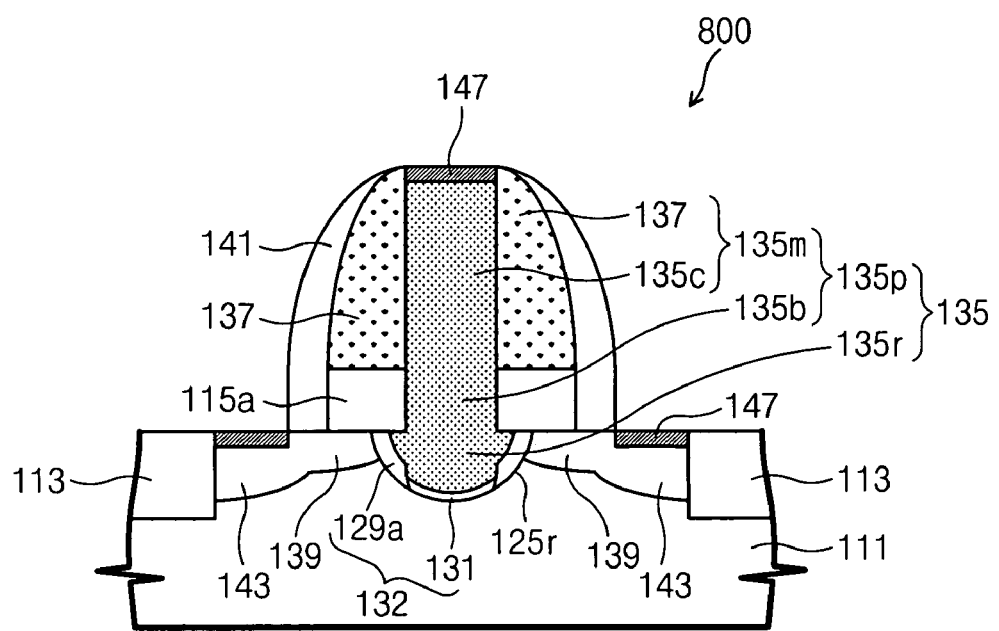
FIG. 8 is a cross-sectional view showing a semiconductor device according to some embodiments of the present invention.

FIG. 8 is a cross-sectional view showing a semiconductor device 800 according to some embodiments of the present invention. Referring to FIG. 8, an active region electrically isolated by a field oxide 113 is defined on a semiconductor substrate 111. The semiconductor substrate 111 includes a recess 125r. A surface of the recess 125r has a smoothly curved shape. For example, the recess 125r may have a semielliptical or hemispherical shape.

A gate electrode 135 fills the recess 125r and has a predetermined height. An insulator 132 is interposed between the semiconductor substrate 111 and a portion of the gate electrode 135 filling the recess 125r, i.e., a recessed gate electrode portion portion 135r on a surface of the recess 125r. The recess 125r may have a thickness of at least about 300 Å, for example.

The gate electrode 135 may include the recessed gate electrode portion portion 135r filling the recess 125r and a protruding gate electrode portion 135p protruding from the semiconductor substrate 111 and connected to the recessed gate electrode portion portion 135r. The protruding gate electrode portion 135p may include a bottom gate electrode portion portion 135b and a main gate electrode portion portion 135m. The bottom gate electrode portion portion 135b has a shorter length than a width of the recess 125r. The main gate electrode portion portion 135m is connected to the bottom gate electrode portion portion 135b. The main gate electrode portion portion 135m has a longer length than a width of the recess 125r. The main gate electrode portion portion 135m may include a main gate electrode center portion portion 135c on the bottom gate electrode portion portion 135b and a main gate electrode portion silicide spacer 137 on sidewalls of the main gate electrode center portion portion 135c. An end of the recess 125r is located between an outer end of the silicide spacer 137 and an outer end of the bottom gate electrode portion portion 135b. The gate electrode thus has a shape of an anchor. The recessed gate electrode portion portion 135r, the bottom gate electrode portion portion 135b and the main gate electrode center portion portion 135c may be formed of polysilicon.

In this specification, the gate length indicates a size of a gate electrode along a direction of a channel. The silicide spacer 137 is for decreasing resistance of the gate electrode and may be formed by a CVD method.

The insulator 132 interposed between the recessed gate electrode portion portion 135$r$ and the semiconductor substrate 111 may include a buffer gate insulator 129$a$ and a gate insulator 131 of different thicknesses. The buffer gate insulator 129$a$ is located on sidewalls of the recess 125$r$. The gate insulator 131 is thinner than the buffer gate insulator 129$a$ and connected to the buffer gate insulator 129$a$ on a bottom of the recess 125$r$. Preferably, the gate insulator 131 is arranged on a bottom of the bottom gate electrode portion portion 135$b$, that is, the buffer gate insulator 129$a$ preferably is located on both sidewalls of the recess 125$r$ of both sidewalls of the bottom gate electrode portion portion 135$b$. The thick buffer gate insulator 129$a$ serves to decrease a parasitic capacitance between the gate electrode 135 and the semiconductor substrate 111 (i.e., source/drain). The thin gate insulator 131 serves as an effective gate insulator. Thus, a short channel transistor may be provided without increase of a parasitic capacitance by properly controlling thicknesses of the buffer gate insulator 129$a$ and the gate insulator 131.

A buffer insulator 115$a$ surrounds the bottom gate electrode portion portion 135$b$ of the gate electrode 135 and is aligned with the outer end of the silicide spacer 137. Also, a gate insulation spacer 141 is disposed on outer sidewalls of the silicide spacer 137 and the buffer insulator 115$a$. The buffer insulator 115$a$ and the gate insulation spacer 141 isolate the gate electrode 135.

A low concentration impurity-doped region 139 is disposed in the semiconductor substrate 111 under the buffer insulator 115$a$ and the gate insulation spacer 141. A high concentration impurity-doped region 143 is disposed in the semiconductor substrate 111 out of the gate insulation spacer 141 and connected to the low concentration impurity-doped region 139. The impurity-doped regions 139 and 143 may be source/drain regions. As described above, a parasitic capacitance occurring due to an overlap of the gate electrode and the source/drain may be decreased due to the thick buffer gate insulator 129$a$. Silicide layers 147 may be disposed on the gate electrode 135 and on the semiconductor substrate 111 out of the gate insulation spacer 141, i.e., on the high concentration impurity-doped region.

Figure 9:
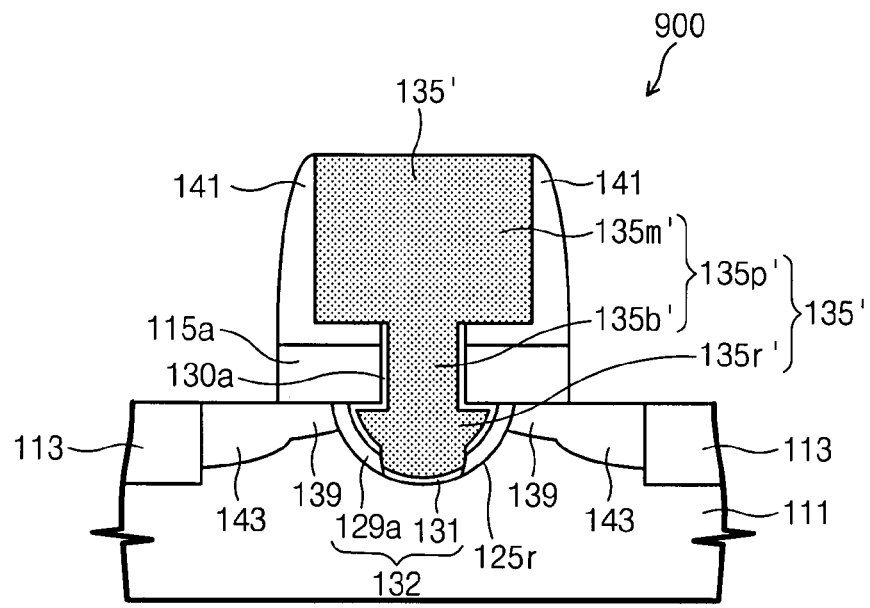
FIG. 9 is a cross-sectional view showing a semiconductor device according to further embodiments of the present invention.

FIG. 9 is a cross-sectional view showing a semiconductor device 900 according to further embodiments of the present invention. The device 900 is similar to the semiconductor device 800 of FIG. 8, with like elements indicated by like reference numerals. The device 900 of FIG. 9 differs from the device 800 of FIG. 8 in that a gate electrode 135' of the device 900 does not include a silicide spacer.

Referring to FIG. 9, a gate electrode 135' includes a recessed gate electrode portion portion 135$r$' filling a recess 125$r$ of a semiconductor substrate 111 and a protruding gate electrode portion 135$p$' connected to the recessed gate electrode portion portion 135$r$'. The protruding gate electrode portion portion 135$p$' includes a bottom gate electrode portion portion 135$b$' and a main gate electrode portion portion 135$m$'. The bottom gate electrode portion 135$b$' portion connects to the recessed gate electrode portion portion 135$r$' and has a gate length that is less than a width of the recess 125$r$. The main gate electrode portion portion 135$m$' connects to the bottom gate electrode portion portion 135$b$' and has a gate length greater than a width of the recess 125$r$.

Similar to the semiconductor device 800 of FIG. 8, an insulator 132 is interposed between the recessed gate electrode portion 135$r$' and the semiconductor substrate 111. The insulator 132 is composed of a buffer gate insulator 129$a$ and a gate insulator 131 of different thicknesses. The buffer gate insulator 129$a$ is thicker than the gate insulator 131 and located on sidewalls of the recess 125$r$. The gate insulator 131 is located on a bottom of the recess 125$r$. The protruding gate electrode portion 135$p$' of the gate electrode 135' is T-shaped. The protruding gate electrode portion 135$p$' and the recessed gate electrode portion portion 135$r$' have an anchor shape.

A nitride liner 130$a$ may be disposed on sidewalls of the bottom gate electrode portion portion 135$b$' and on the buffer gate insulator 129$a$. The device 800 further includes a gate insulation spacer 141 and a buffer insulator 115$a$. The gate insulation spacer 141 is disposed on sidewalls and a bottom surface of the main gate electrode portion portion 135$m$'. The buffer insulator 115$a$ surrounds the bottom gate electrode portion portion 135$b$'. The buffer insulator 115$a$ is aligned with the gate insulation spacer 141. The gate insulation spacer 141 is L-shaped.

Similar to the semiconductor device of FIG. 8, a low concentration impurity-doped region 139 is disposed in the semiconductor substrate 111 under the gate insulation spacer 141 and the buffer insulator 115$a$. A high concentration impurity-doped region 143 is disposed in the semiconductor substrate 111 under the gate insulation spacer 141. The gate electrode 135' may be formed of polysilicon.

Figure 10:
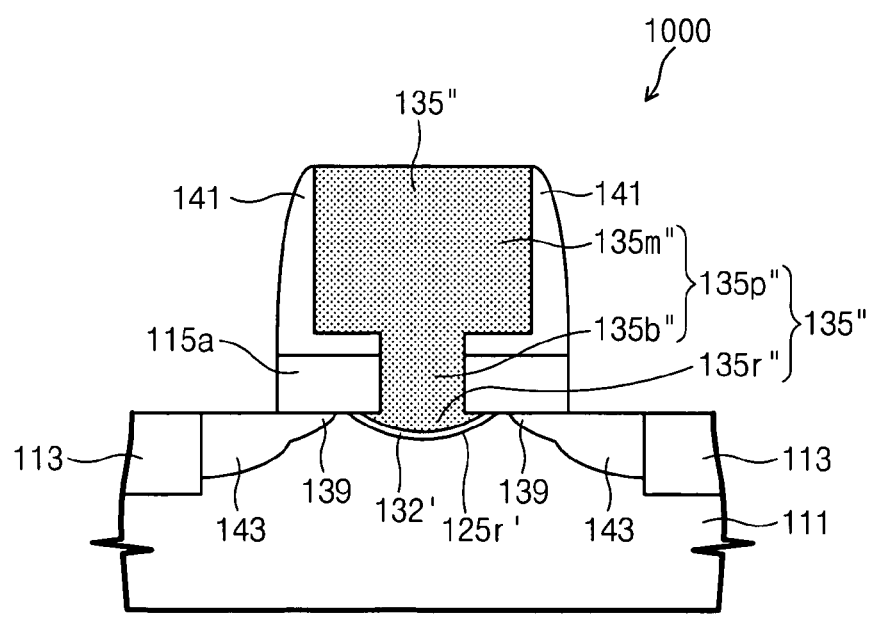
FIG. 10 is a cross-sectional view showing a semiconductor device according to still further embodiments of the present invention.

FIG. 10 is a cross-sectional view showing a semiconductor device 1000 according to still further embodiments of the present invention. The device 1000 is similar to the device 900 of FIG. 9, with like items indicated by like reference numerals. The device 1000 differs from the device 900 of FIG. 9 in that a recess of the device 1000 is shallower than a corresponding recess of the device 900, and an insulator formed on a surface of the recess has a single insulation layer with a constant thickness.

Referring to FIG. 10, the semiconductor device 1000 includes a semiconductor substrate 111 having a recess 125$r$'. The recess 125$r$' has a depth of about 50 Å. A gate electrode 135" includes a recessed gate electrode portion portion 135$r$'" filling the recess 125$r$' of the semiconductor substrate 111 and a protruding gate electrode portion 135$p$'" connected to the recessed gate electrode portion portion 135$r$'". The protruding gate electrode portion 135$p$'" includes a bottom gate electrode portion portion 135$b$'" and a main gate electrode portion portion 135$m$'". The bottom gate electrode portion portion 135$b$'" connects to the recessed gate electrode portion portion 135$r$'" and has a gate length that is less than a width of the recess 125$r$'. The main gate electrode portion portion 135$m$'" connects to the bottom gate electrode portion portion 135$b$'" and has a gate length that is less than the width of the recess 125$r$'". An insulator 132' is interposed between the recessed gate electrode portion portion 135$r$'" and the semiconductor substrate 111. The insulator 132' is a single insulation layer with a constant thickness.

Figure 11:
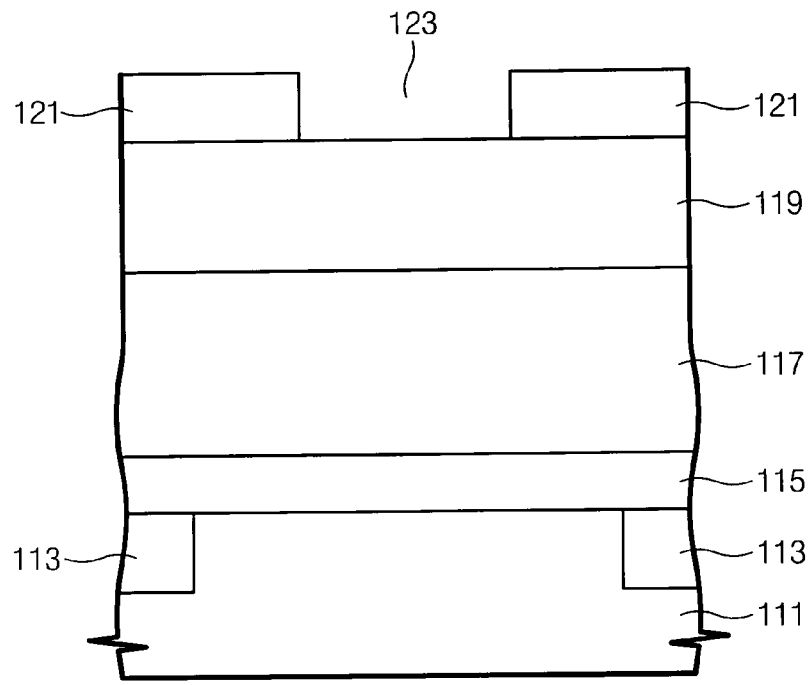
FIGS. 11 through 25 are cross-sectional views showing operations for forming the semiconductor device of FIG. 8.

FIGS. 11 through 25 are cross-sectional views showing exemplary operations for forming the semiconductor device 800 of FIG. 8. Referring to FIG. 11, a field oxide 113 is formed on a semiconductor substrate 111 using, for example, a conventional process. An active region is defined by the field oxide 113. The conventional process may be, for example, a shallow trench isolation (STI) process.

A pad oxide layer 115, a sacrificial nitride layer 117 and an optional planarization buffer layer 119 are sequentially formed on the semiconductor substrate 111. The optional planarization buffer layer 119 is formed of a material having an etch selectivity with respect to the sacrificial nitride layer 117, for example, an oxide. The pad oxide layer 115 may be formed by, for example, a thermal oxidation process or a CVD process. The sacrificial nitride layer 117 and the selective planarization buffer layer 119 may be formed by using, for example, a CVD process. A thickness of the sacrificial nitride layer 117 is substantially the same as a height of a gate electrode that will be formed in a subsequent process. The optional planarization buffer layer 119 will be patterned in a subsequent patterning process, so that the sacrificial nitride layer 117 has a desirable profile (i.e., a gate electrode having a vertical sidewall may be formed). The optional planarization buffer layer 119 may not be formed according to a process condition.

A photo resist pattern 121 is formed on the optional planarization buffer layer 119. The photoresist pattern 121 may be formed by using the following steps: The semiconductor substrate 111 is coated with a photoresist layer, which is exposed to light by using a predetermined reticle to form the photoresist pattern 121. The photoresist pattern 121 has an opening 123 therein. The opening 123 defines a shape of a gate electrode that will be formed in a subsequent process.

Figure 12A:
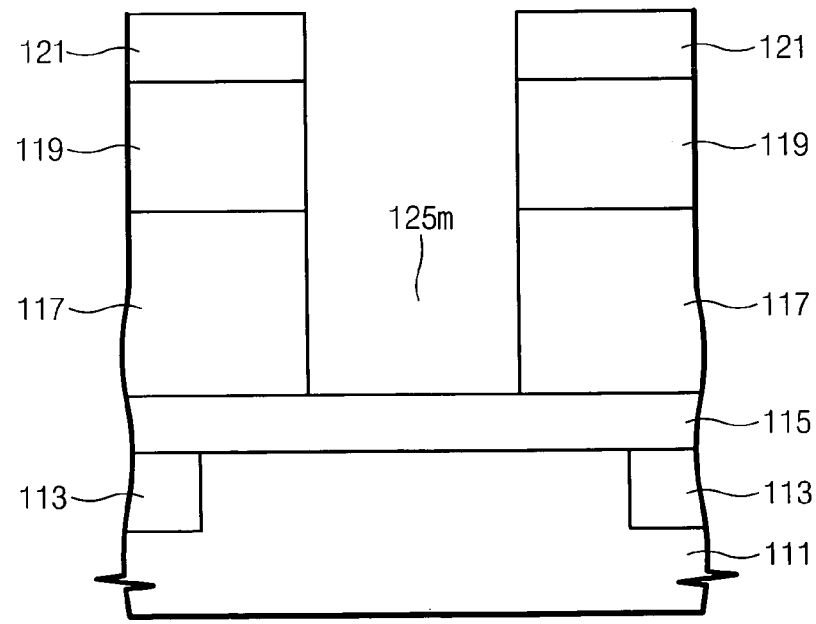
Figure 12B:
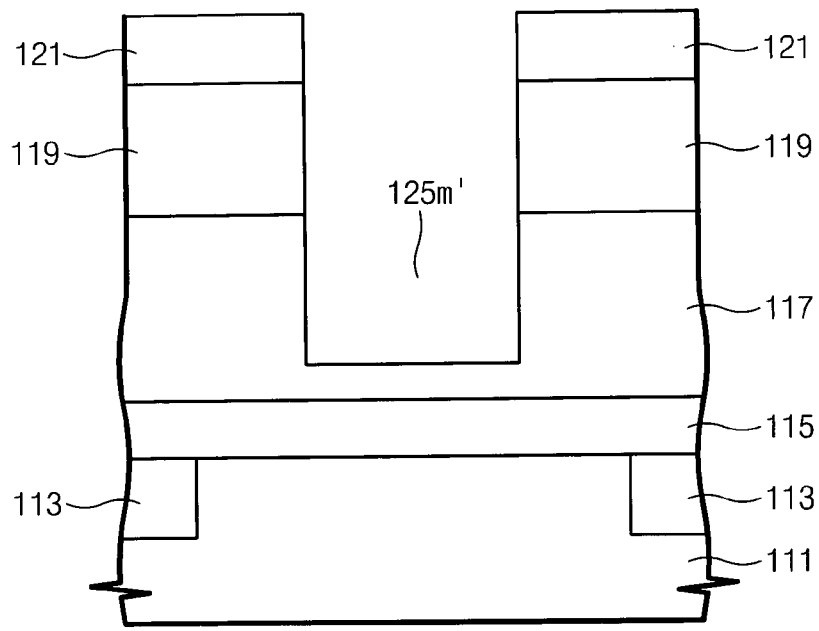
Figure 13A:
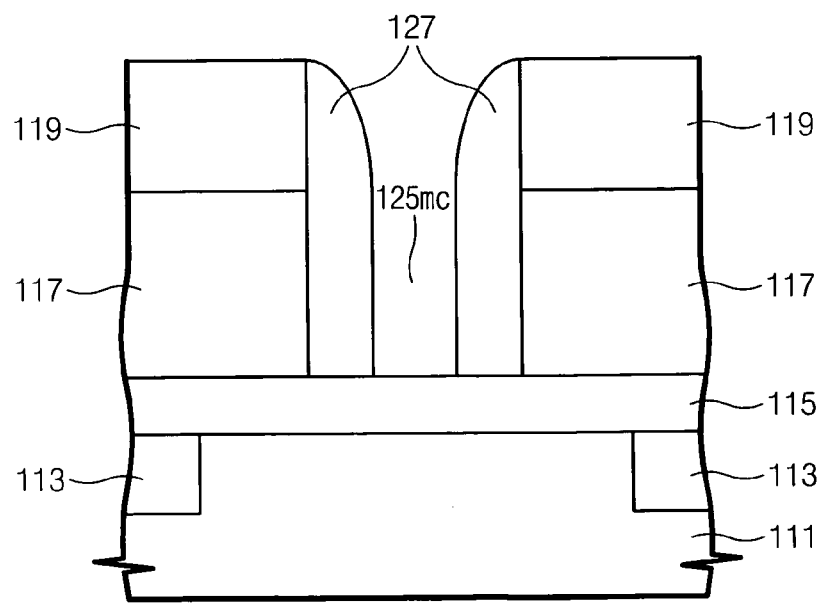
Figure 13B:
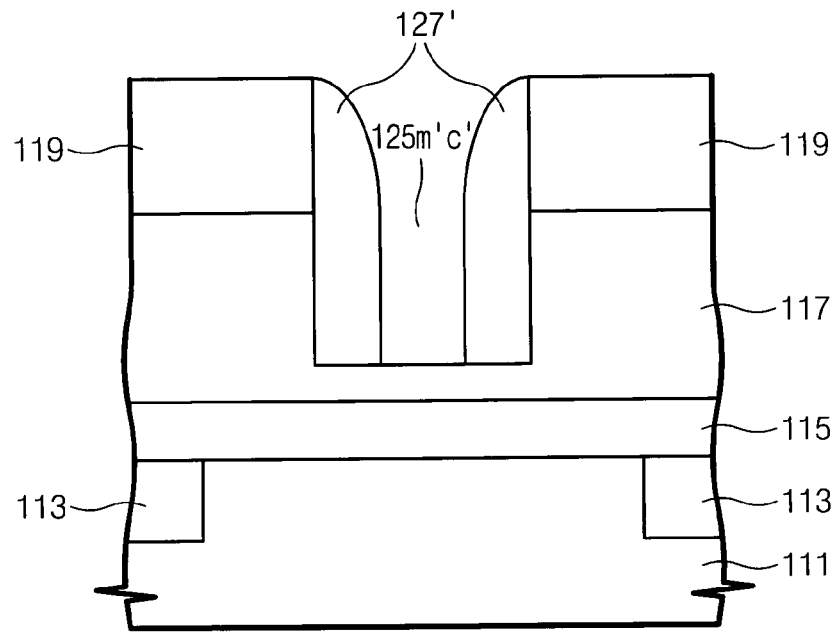
Figure 14A:
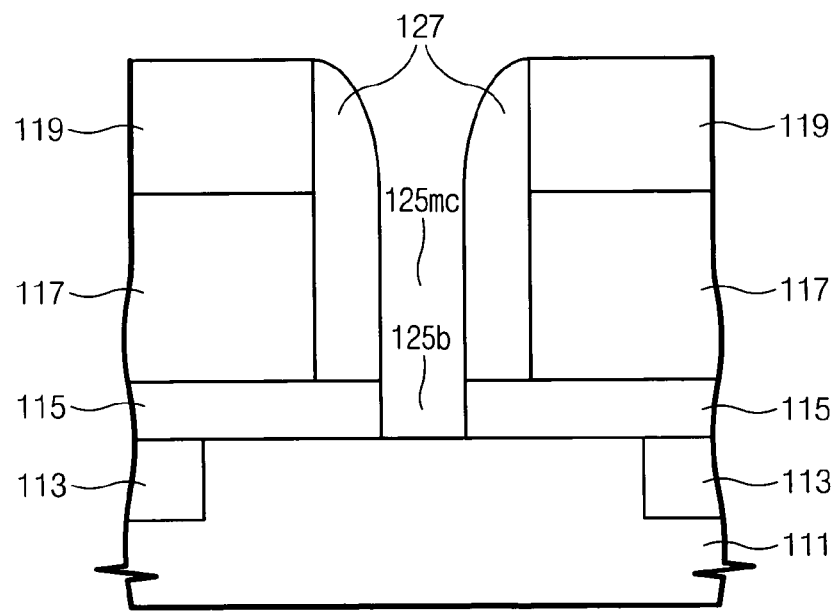
Figure 14B:
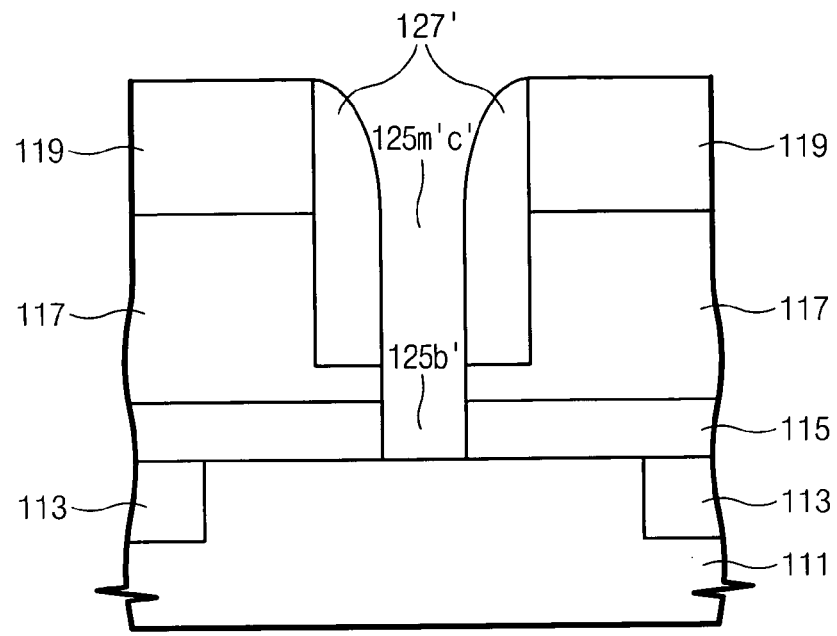

A gate electrode groove may be formed by using either of two methods as illustrated in FIGS. 12A, 13A and 14A and in FIGS. 12B, 13B and 14B. Referring to FIG. 12A, the optional planarization buffer layer 119 and the sacrificial nitride layer 117 exposed by the opening 123 in the photoresist pattern 121 are anisotropically etched until the pad oxide layer 115 is exposed, thereby forming a main gate electrode groove 125m in the sacrificial nitride layer 117. Referring to FIG. 13A, the photoresist pattern 121 is removed, and a groove spacer 127 is formed on inner sidewalls of the main gate electrode groove 125m, thereby forming a main gate electrode center portion groove 125mc having a shorter width than the main gate electrode groove 125m. Thus, it is possible to form a channel having a short width exceeding resolution capability of a photolithography process. The groove spacer 127 may be formed of silicon nitride or high-density plasma enhanced tetraethylorthosilicate (TEOS). In order to form the groove spacer 127, a nitride layer or a high-density plasma oxide layer is conformally formed on the semiconductor substrate 111 where the photoresist pattern 121 is removed, and the nitride or plasma oxide layer is then anisotropically etched. Referring to FIG. 14A, the exposed pad oxide layer 115 is etched using the groove spacer 127 as an etch mask, thereby forming a bottom gate groove 125b defined by the pad oxide 115 that exposes a portion of the semiconductor substrate 111.

An alternative way of forming a protruding gate electrode groove is explained by referring to FIGS. 12B, 13B and 14B. Referring to FIG. 12B, the optional planarization buffer layer 119 and a part of the sacrificial nitride layer 117 are anisotropically etched using the photoresist pattern 121 as an etch mask, thereby forming a main gate electrode groove 125m' that exposes a remaining sacrificial nitride layer 117. The sacrificial nitride layer 117 is totally etched to expose the pad oxide pattern 115 in FIG. 12A.

Referring to FIG. 13B, a groove spacer 127' is formed on sidewalls of the main gate electrode groove 125m' by using the technique as described above with reference to FIG. 13A, thereby defining a main gate electrode center portion groove 125m'c'. Referring to FIG. 14B, the remaining sacrificial nitride layer 117 and the pad oxide layer 115 are anisotropically etched using the groove spacer 127' as an etch mask, which exposes a portion of the semiconductor substrate 111. A bottom gate electrode groove 125b' is formed through the remaining sacrificial nitride layer 117 and the pad oxide layer 115. The technique of FIGS. 12B, 13B and 14B has a difference of height of the bottom gate electrode portion groove in comparison with the technique of FIGS. 12A, 13A and 14A.

Figure 15:
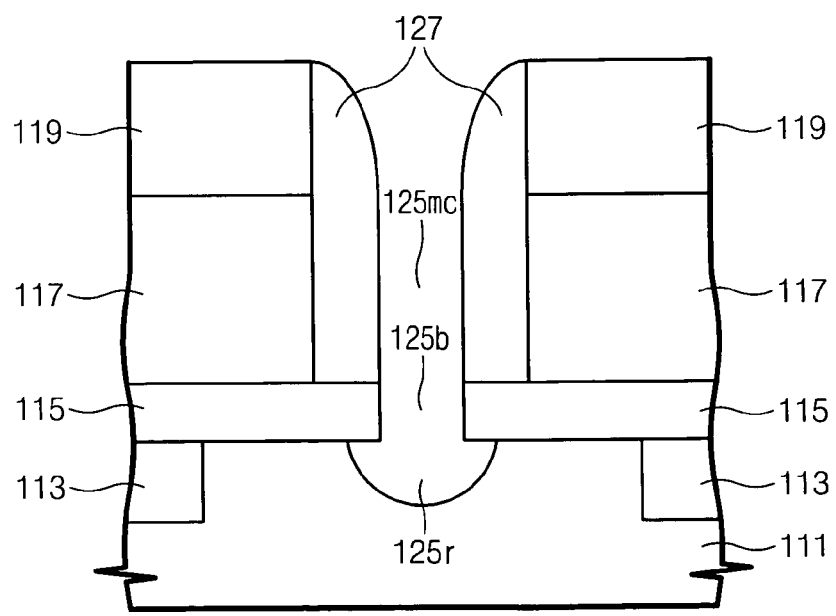

Subsequent processes to those shown in FIGS. 12A, 13A and 14A will now be described. Referring to FIG. 15, after forming the bottom gate electrode groove 125b, the exposed semiconductor substrate 111 is isotropically etched to form a recess 125r. The recess 125r may be formed by a wet etching or chemical dry etching. The recess 125r has a width that is narrower than a width of the main gate electrode groove 125m of FIG. 12A and wider than a width of the bottom gate electrode groove 125b. The contour of the recess 125r may be a smooth curve, such as a hemispherical or semielliptical shape. The recess 125r may have a thickness greater than about 300 Å.

Figure 16:
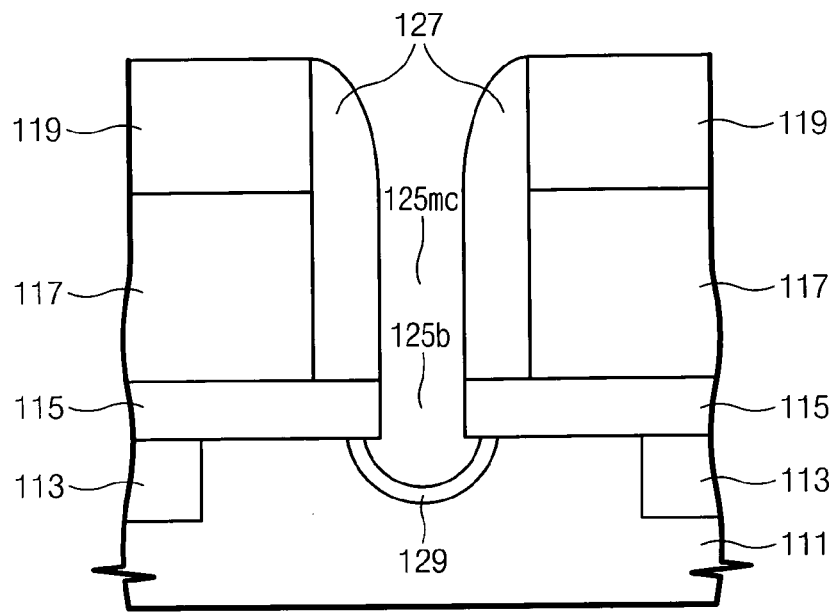

Referring to FIG. 16, a buffer gate insulator 129 is formed at a surface of the recess 125r and has first thickness. Fort example, the buffer gate insulator 129 may be formed by a thermal oxidizing process and with a thicker thickness than a desired thickness of a gate insulator. A channel ion-implantation process is performed to prevent punch through and control threshold voltage. In particular, impurity ions are implanted in the semiconductor substrate 111 under the recess 125r through the buffer gate insulator 129.

Figure 17:
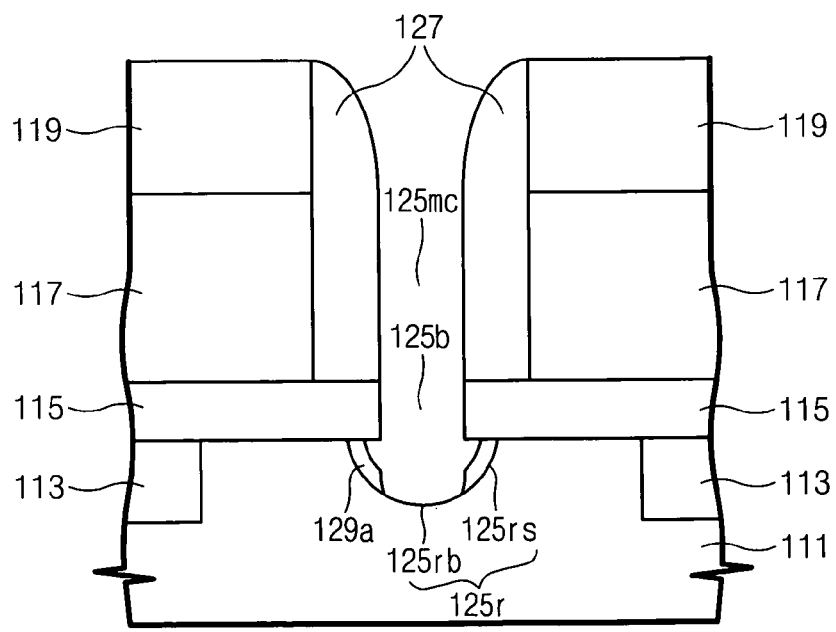

Referring to FIG. 17, the buffer gate insulator 129 is anisotropically etched. Namely, anisotropic dry etch is carried out on the gate insulator 129 to remove a portion of the gate insulator 129 on the bottom portion 125rb of the recess 125r exposed by the bottom gate electrode grove 125b. Also, wet etch can be employed to remove a portion of the gate insulator 129 on the bottom portion 125rb of the recess 125r exposed by the bottom gate electrode grove 125b. As a result, a buffer gate insulator 129a remains on sidewalls of the recess 125r, and a bottom portion 125rb of the recess 125r having a width about the same as the width of the bottom gate electrode groove 125b is exposed.

Figure 18:
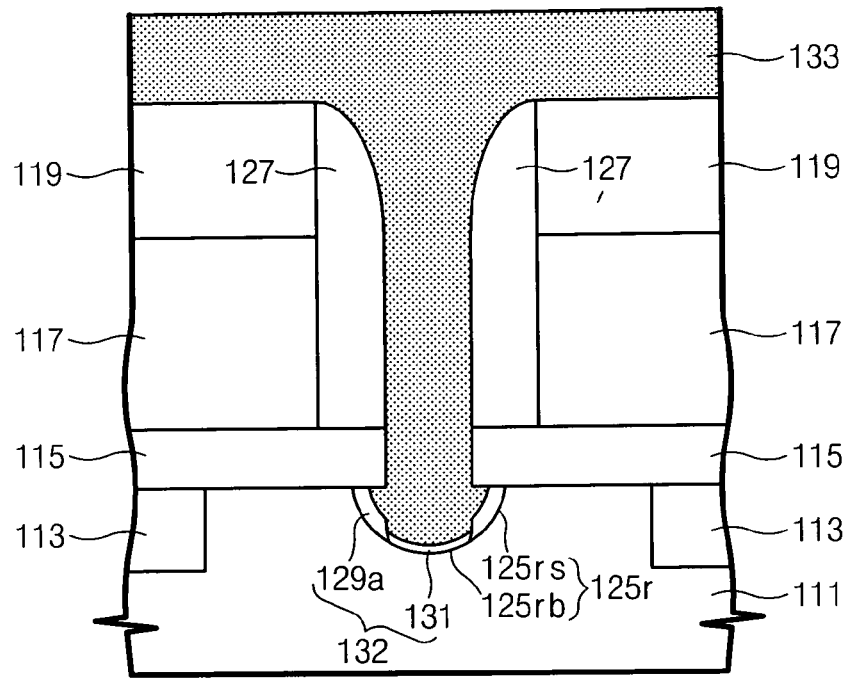

Referring to FIG. 18, a gate insulator 131 is formed on the bottom portion 125rb of the recess 125r. The gate insulator 131 has a thickness less than the thickness of the buffer gate insulator 129a. The gate insulator 131 may be formed by thermal oxidation.

Although not illustrated, after the buffer gate insulator 129 is formed, a nitride liner may be formed. The nitride liner may be anisotropically etched to expose the buffer gate insulator 129. Then, the exposed buffer gate insulator 129 may be isotropically etched to expose a portion of the semiconductor substrate 111. A thermal oxidation process may then be performed to form a thinner gate insulator than the buffer gate insulator on the exposed semiconductor substrate 111.

Referring again to FIG. 18, after forming the gate insulator 131 on the bottom 125rb of the recess 125r, a gate electrode material layer 133 is formed on the optional planarization buffer layer 119 to fill the recess 125r, the bottom gate electrode groove 125b through the pad insulator 115, and the main gate electrode center portion groove 125mc through the sacrificial nitride layer 117. The gate electrode material layer 133 may comprise, for example, polysilicon.

Figure 19:
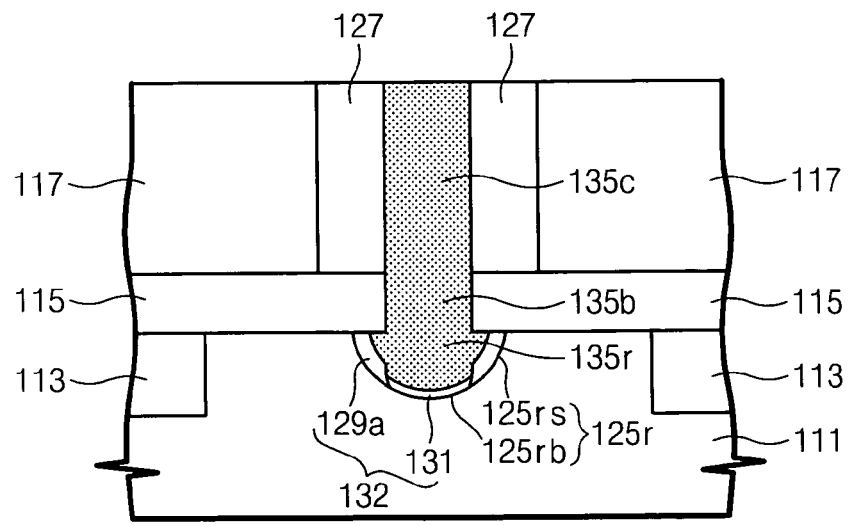

Referring to FIG. 19, a planarization process is performed until the sacrificial nitride layer 117 is exposed, thereby forming a recessed gate electrode portion 135r in the recess 125r, a bottom gate electrode portion 135p in the bottom gate electrode groove 125b and a main gate electrode center portion 135c in the main gate electrode center portion groove 125mc. The planarization process may be, for example, a chemical mechanical polishing (CMP) or an etch back process. The sacrificial nitride layer 117 functions as a planarization stopping layer during the planarization process.

Figure 20:
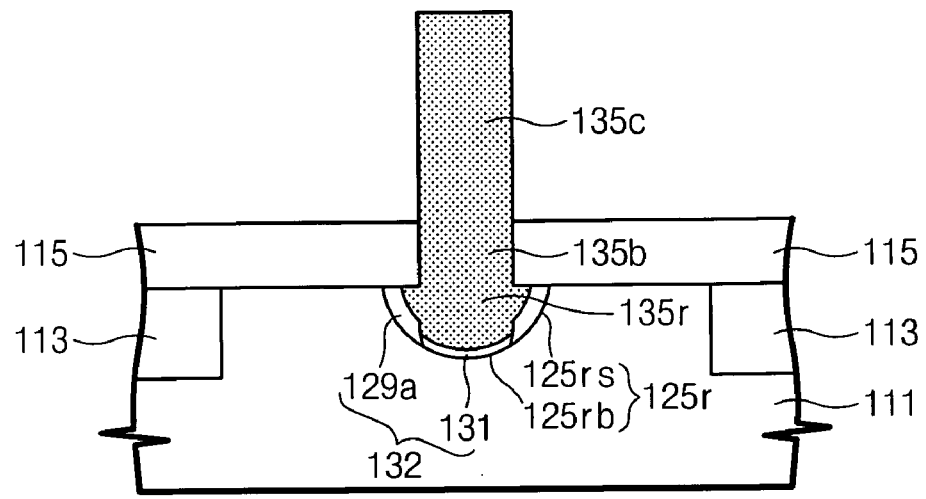

Referring to FIG. 20, the sacrificial nitride layer 117 and the groove spacer 127 are removed to expose the main gate electrode center portion 135c. If the groove spacer 127 is formed of a nitride, the sacrificial nitride layer 117 and the groove spacer 127 may be removed using the same solution, such as phosphoric acid. If the groove spacer 127 is formed of high-density plasma enhanced TEOS, the sacrificial nitride layer 117 may be removed first by using the phosphoric acid, and then the groove spacer 127 may be removed by using a conventional oxide etch solution.

Figure 21:
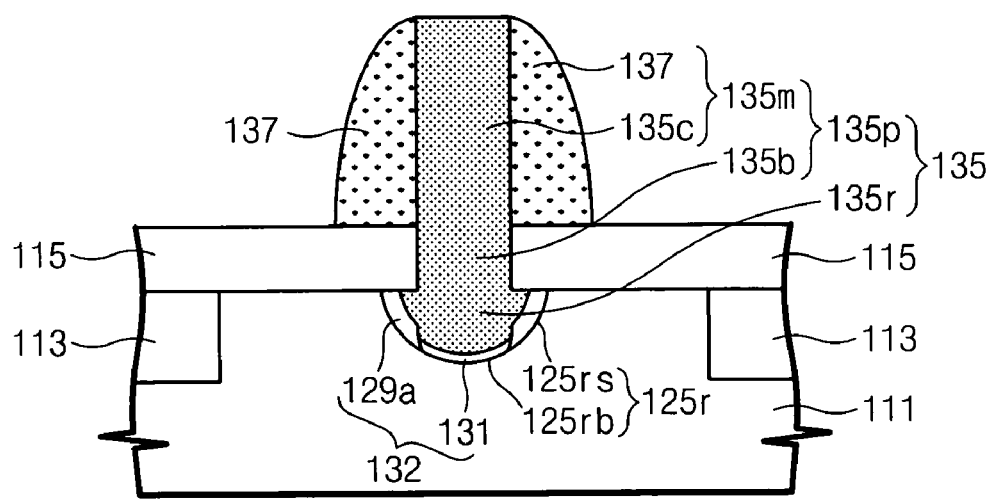

Referring to FIG. 21, a silicide spacer 137 is formed at sidewalls of the exposed main gate electrode center portion 135c. The gate electrode center portion 135c and the silicide spacer 137 form a main gate electrode portion 135m, and the main gate electrode portion 135m and the bottom gate electrode portion 135b form a protruding gate electrode portion 135p. The protruding gate electrode portion 135p and the recess gate electrode portion 135r form a gate electrode 135 having a shape of an anchor.

In order to form the silicide spacer 137, a metal silicide layer may be formed by a conventional method, such as CVD, and etched back. A metal silicide layer may be conformally formed on the gate electrode center 135c and the pad oxide layer 115 and the metal silicide layer is etched back until the pad oxide layer 115 is exposed. As a result, a metal silicide layer remains on sidewalls of the main gate electrode center portion portion 135c as a spacer. The silicide spacer 137 may be formed of, for example, tungsten silicide or cobalt silicide. A barrier layer may be formed before forming the silicide spacer 137. The barrier layer may be formed of, for example, titanium silicide.

Figure 22:
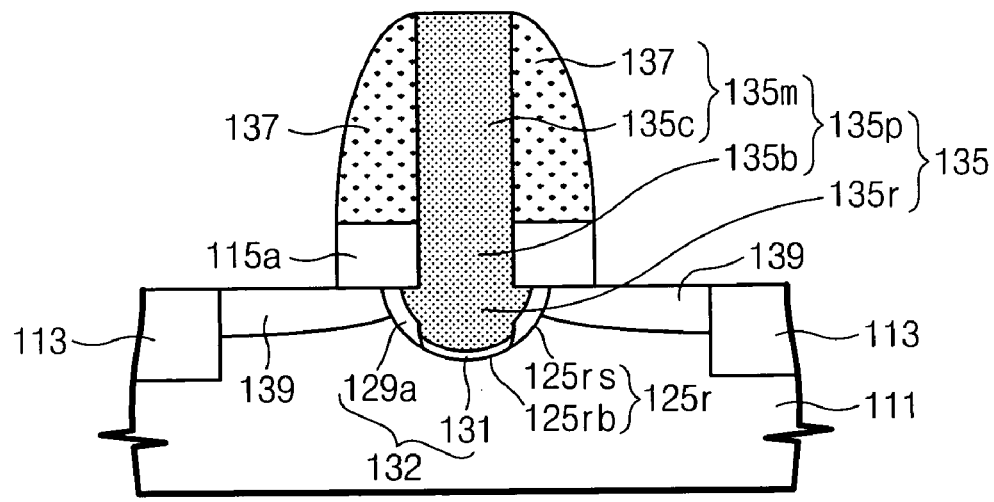

Referring to FIG. 22, after forming the silicide spacer 137, the exposed pad oxide layer 115 is etched back such that the portion of pad oxide layer 115 that does not underlie the silicide spacer 137 is removed to expose the semiconductor substrate 111 and a portion 115a of the pad oxide layer 115a remains under the silicide spacer 137. A low concentration impurity-doped region 139 may then be formed into the exposed semiconductor substrate 111 adjacent to the silicide spacer 137 by implanting impurity ions of low concentration to form a lightly doped drain (LDD) region. The low concentration impurity-doped region 139 preferably has a depth that is substantially the same as that of the recess 125r. Depths of the low concentration impurity-doped region and a subsequent high concentration impurity-doped region may be dependent on the depth of the recess 125r.

Figure 23:
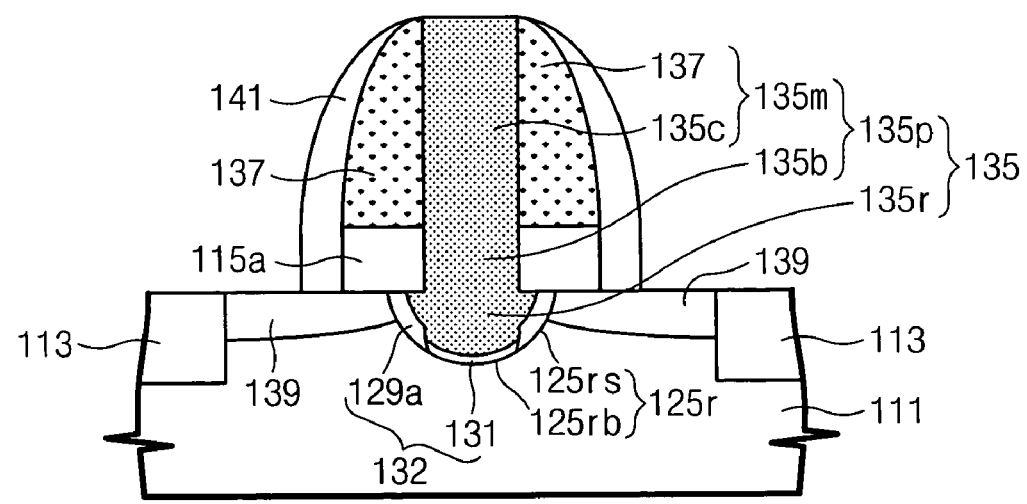

Referring to FIG. 23, a gate insulation spacer 141 is formed on sidewalls of the remaining pad oxide 115a and the silicide spacer 137. The gate insulation spacer 141 may be formed from a nitride material. In order to form the gate insulation spacer 141, a nitride layer may be conformally formed and etched back.

Figure 24:
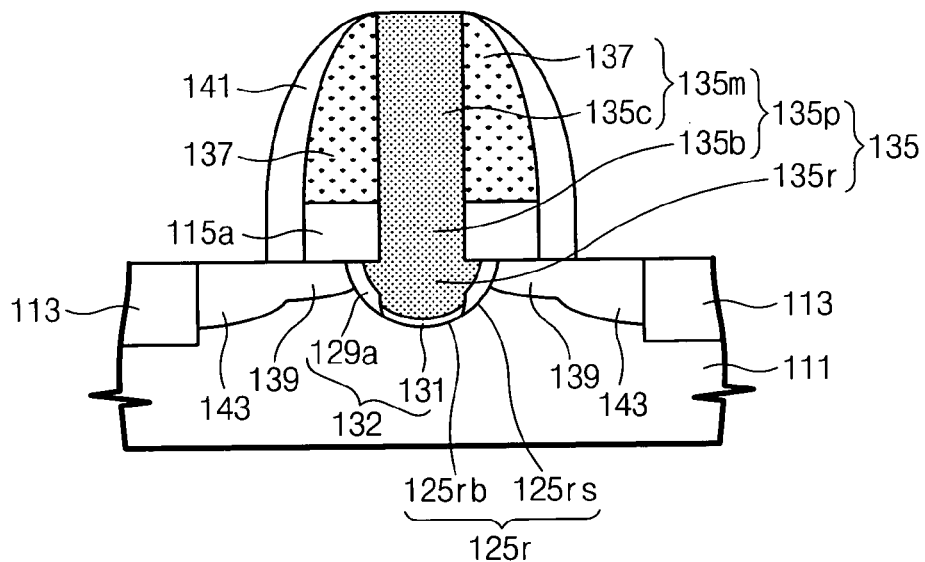

Referring to FIG. 24, impurity ions of high concentration are implanted into the semiconductor substrate 111 adjacent to the gate insulation spacer 141 using the gate insulation spacer 141 as an ion-implantation mask, thereby forming a high concentration impurity-doped regions 143. The high concentration impurity-doped regions 143 and the low concentration impurity-doped regions 139 serve as source/drain regions. The high concentration impurity-doped region 143 may be more deeply formed than the low concentration impurity-doped region 139.

The ion-implantation process for formation of the low concentration impurity-doped region may be omitted. That is, if the recess 125r is formed to a depth of about 800 Å, the ion-implantation process for formation of the low concentration impurity-doped region may be omitted. In such a case, when the ion-implantation process for formation of the high concentration impurity-doped region is performed, the low concentration impurity-doped region may be simultaneously formed according to a concentration profile. However, the ion-implantation process for formation of the low concentration impurity-doped region may be omitted even though the recess has a different depth.

Figure 25:
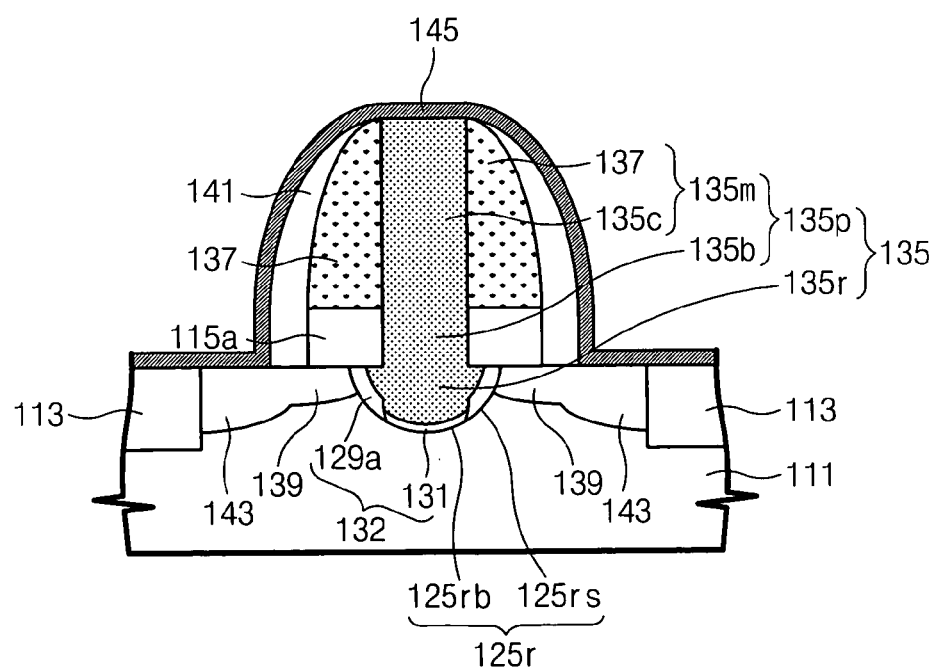

Referring to FIG. 25, a metal layer 145 comprising cobalt, titanium or nickel is formed on the semiconductor substrate 111 on the exposed semiconductor substrate 111, on the gate insulation spacer 141 and on an upper surface of the gate electrode 135. The metal layer 145 is thermally treated to form a silicide layer 147 on the high concentration impurity-doped region 143 and on an upper surface of the gate electrode 135.

Figure 26:
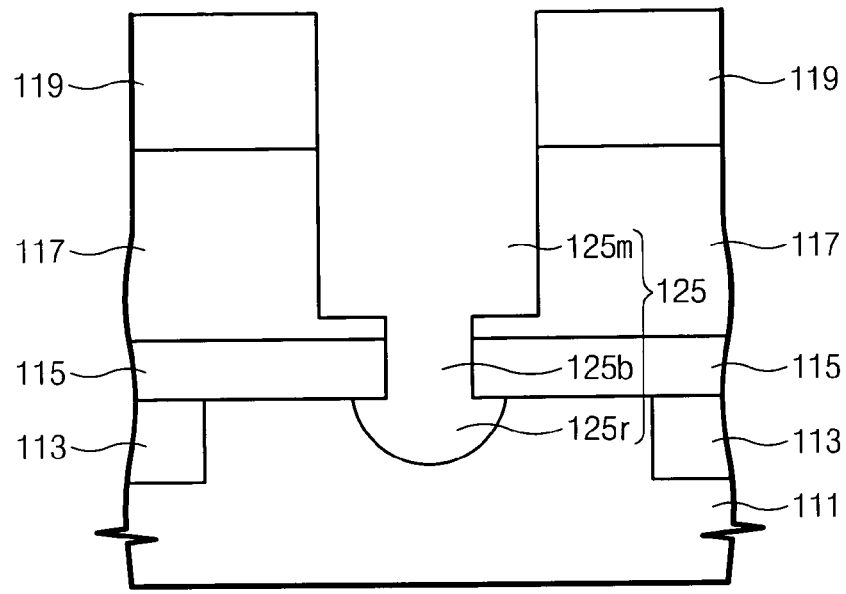
FIGS. 26 through 31 are cross-sectional views showing operations for forming the semiconductor device of FIG. 9.

Operations for forming the semiconductor device 900 of FIG. 9 will now be explained with reference to FIGS. 26 through 31. Discussion of like operations described above with reference to FIGS. 10 through 25 will be omitted. Referring to FIG. 26, a gate electrode center groove 125m'c' and a bottom gate electrode groove 125b are formed as described above with reference to FIGS. 11, 12B, 13B and 14B. A groove spacer 127' is removed to form a main gate electrode groove 125m and a bottom gate electrode groove 125b. The exposed semiconductor substrate 111 is isotropically etched to form a recess 125r. A width of the recess 125r is less than that of the main gate pattern groove 125m but greater than that of the bottom gate electrode groove 125b.

Figure 27:
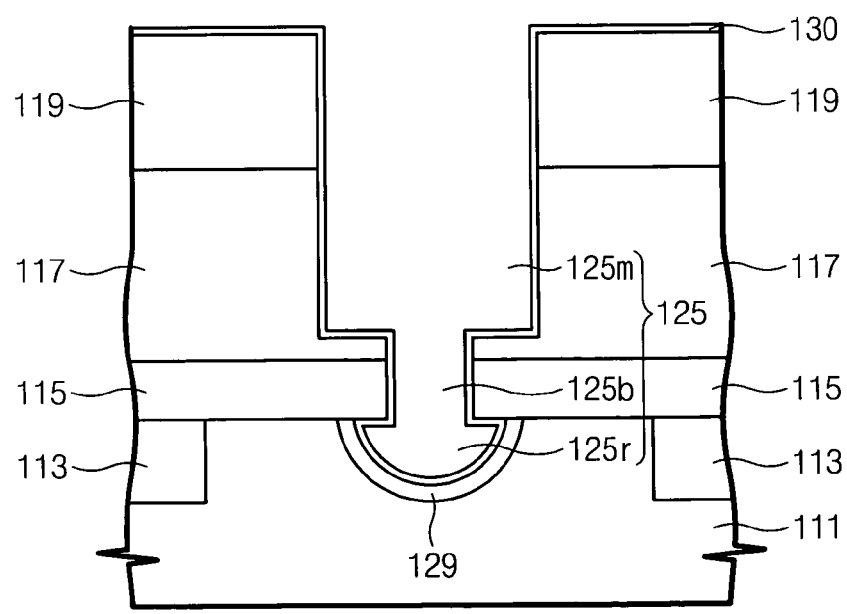

Referring to FIG. 27, a buffer gate insulator 129 of a first thickness is formed on a surface of the recess 125r using a thermal oxidation process. A nitride liner 130 is formed on the semiconductor substrate 111 where the buffer gate insulator 129 is formed, i.e., on the buffer gate insulator 129, on inner walls of the gate electrode groove 125 and on the planarization buffer layer 119. The nitride liner 130 may be formed using a CVD process.

Figure 28:
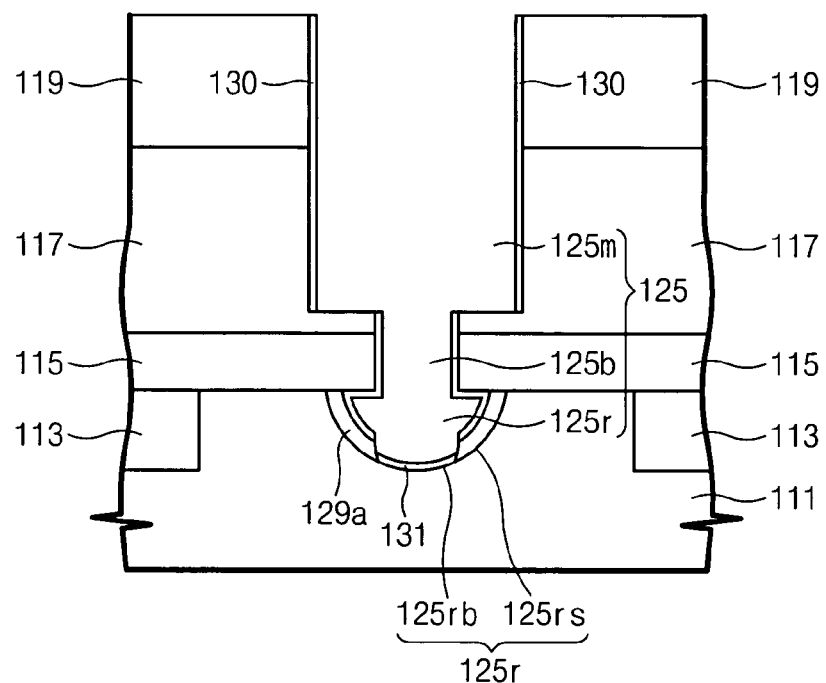

Referring to FIG. 28, an etch back process is performed to remove the nitride liner 130 on the bottom 125rb of the recess 125r and expose a part of the buffer gate insulator 129. The exposed part of the buffer gate insulator 129 is etched to expose the bottom 125rb of the recess 125r of the semiconductor substrate 111. The buffer gate insulator on both sidewalls 125rs of the recess 125r is not removed. The removal of the exposed part of the buffer gate insulator 129 can be done by dry etch or wet etch. A gate insulator 131 is formed on the bottom 125rb of the recess 125r, and is relatively thinner than the buffer gate insulator 129. The gate insulator 131 may be formed by using a thermal oxidation process.

Figure 29:
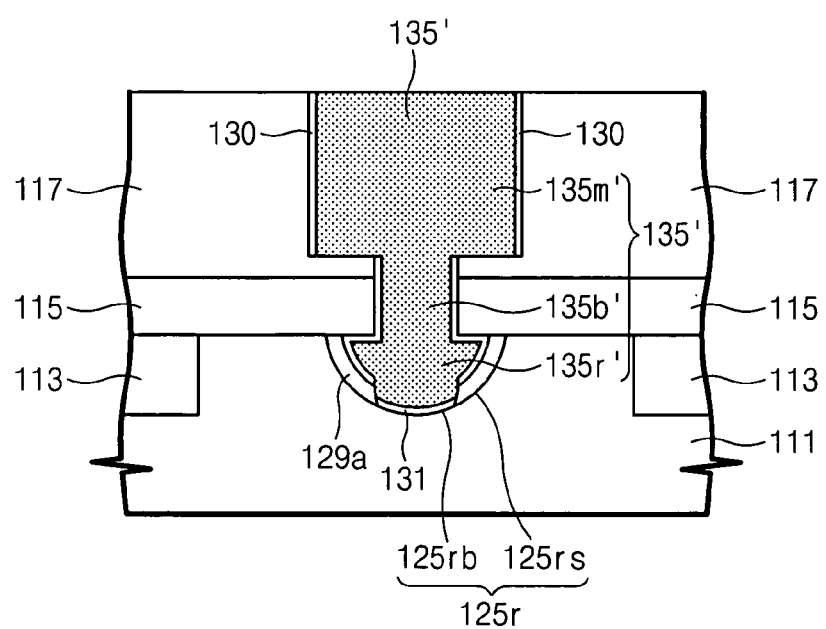

Referring to FIG. 29, a conductive material, such as polysilicon, is formed to fill the gate electrode groove 125 and planarized down to the sacrificial nitride layer 117, thereby forming a gate electrode 135'. The gate electrode 135' includes a recessed gate electrode portion 135r' filling the recess 125r, a bottom gate electrode portion 135b' filling the bottom gate electrode groove 125b and a main gate electrode portion 135m' filling the main gate electrode portion groove 125m.

Figure 30:
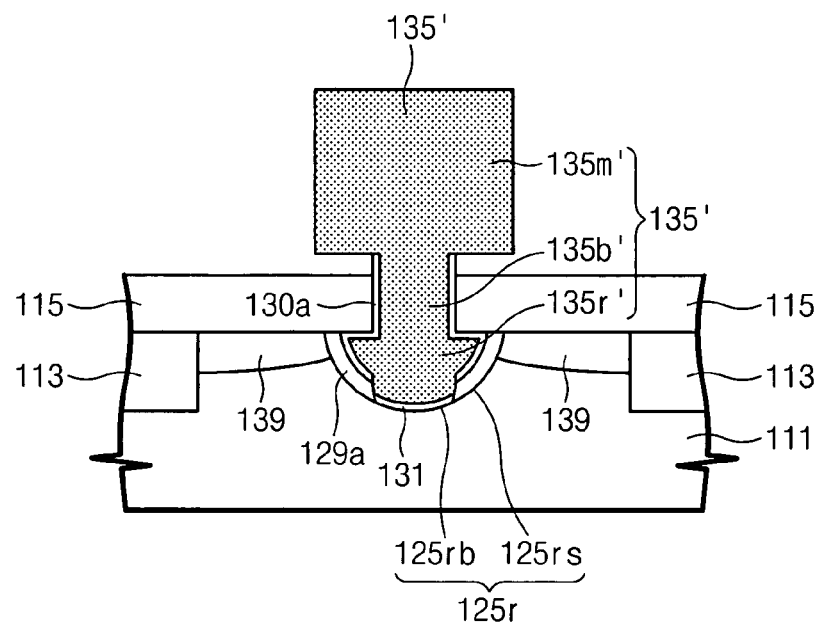

Referring to FIG. 30, the sacrificial nitride layer 117 is removed using an etch solution, such as phosphoric acid. The nitride liner on the sidewalls of the main gate electrode portion 135m' and the remaining sacrificial nitride layer 117 may be simultaneously removed. Thus, a bottom surface of the main gate electrode portion 135m' may be partially exposed. Using operations described above, a low concentration impurity-doped region 139 may be formed by implanting impurity ions of low concentration using the gate electrode 135' as an ion-implantation mask.

Figure 31:
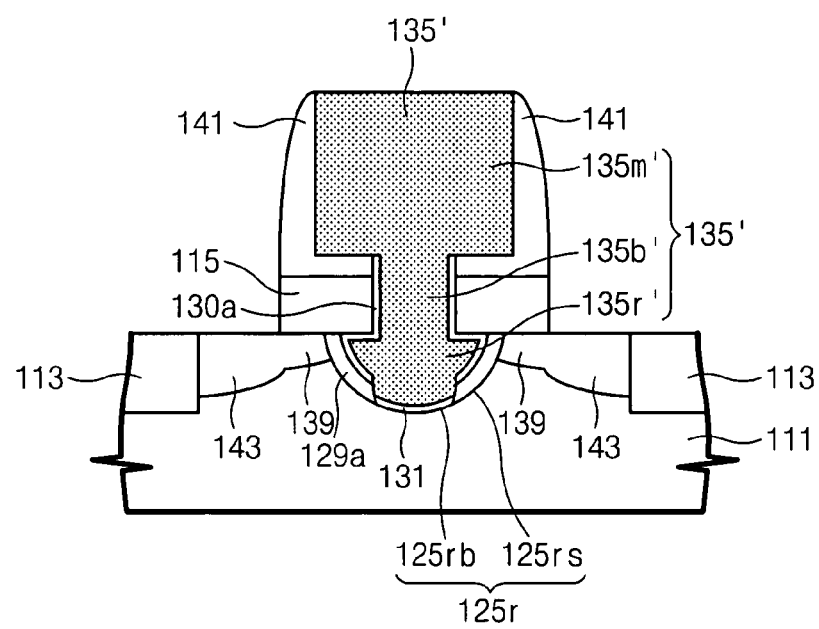

Referring to FIG. 31, a nitride layer is formed on the resultant structure having the low concentration impurity-doped region 139. An etch back process is performed with respect to the nitride layer to form a gate insulation spacer 141. The etch back process is performed until the buffer oxide layer 115 is exposed. An etch back process is then performed with respect to the exposed buffer oxide layer 115, thereby exposing the semiconductor substrate 111 that does not underlie the gate insulation spacer 141 while leaving a buffer oxide layer 115a under the gate insulation spacer 141. A high concentration impurity-doped region 143 is formed by implanting impurity ions of high concentration using the gate insulation spacer 141 as an ion-implantation mask.

Figure 32:
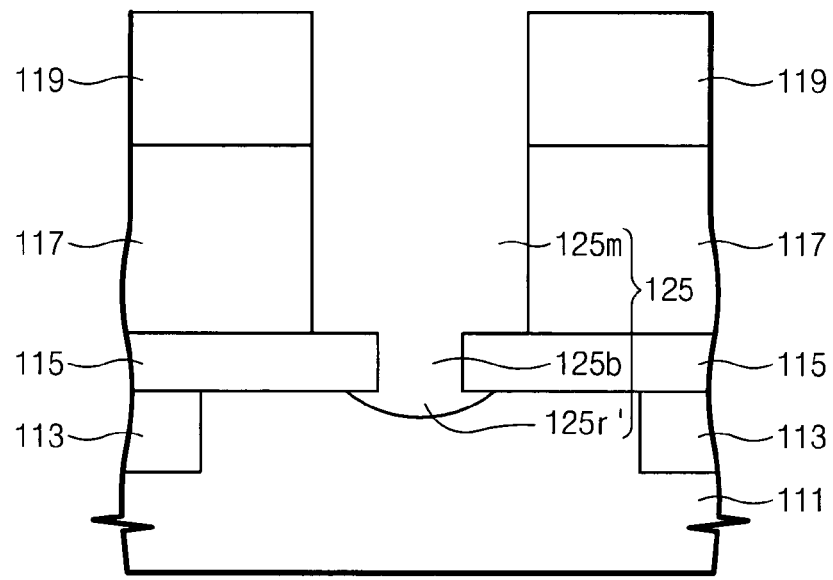
FIGS. 32 through 36 are cross-sectional views showing operations for forming the semiconductor device of FIG. 10.

Operations for forming the semiconductor device 1000 of FIG. 10 will now be explained with reference to FIGS. 32 through 36. Discussion of like operations described above will be omitted. Referring to FIG. 32, described above with reference to FIGS. 11, 12A, 13A and 14A, after forming a main gate electrode center portion groove 125mc and a bottom gate electrode groove 125b, a groove spacer 127 is removed, thereby forming a main gate electrode groove 125m and a bottom gate electrode groove 125b. The exposed semiconductor substrate 111 is isotropically etched to form a recess 125r'. The recess 125r' may have a very shallow depth, e.g., about 50 Å. The recess part 125r' has a width not exceeding that of the main gate electrode groove 125m.

Figure 33:
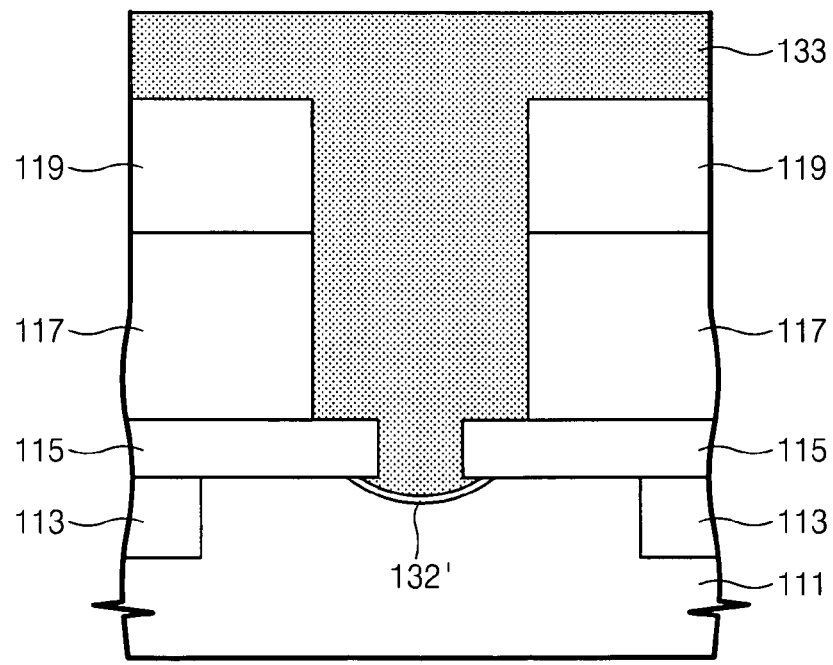

Referring to FIG. 33, a gate insulator 132' is formed on a surface of the recess 125r'. The gate insulator 132' may be formed by using a thermal oxidation process. The gate insulator 132' has a constant thickness, in contrast to gate insulators of the aforedescribed embodiments. A gate electrode material 133 is formed on the planarization buffer layer 119, thereby filling the gate electrode groove 125.

Figure 34:
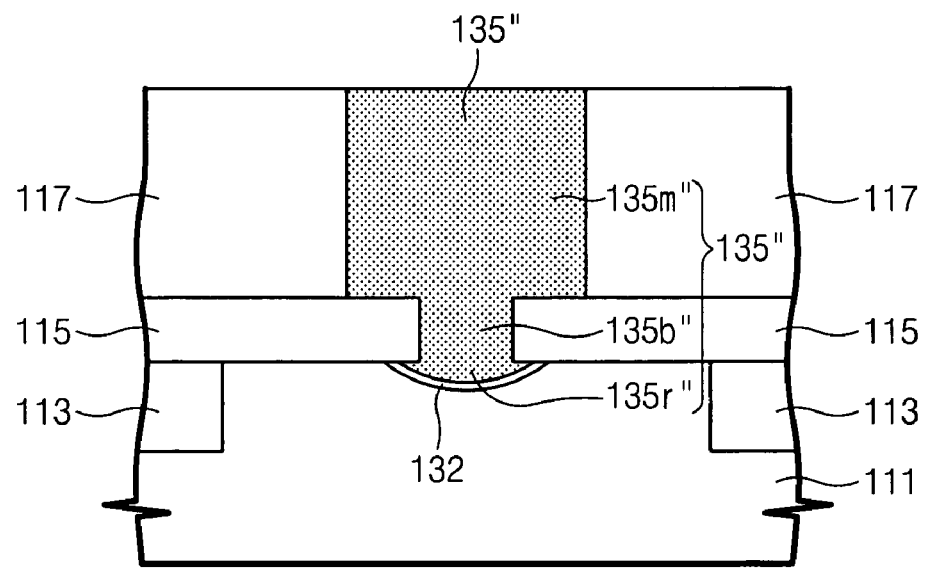

Referring to FIG. 34, a planarization process is performed until the sacrificial nitride layer 117 is exposed, thereby forming a gate electrode 135". The gate electrode 135" includes a recessed gate electrode portion 135r" filling the recess 125r', a bottom gate electrode portion 135b" filling the bottom gate electrode groove 125b, and a main gate electrode portion 135m" filling the main gate electrode groove 125m.

Figure 35:
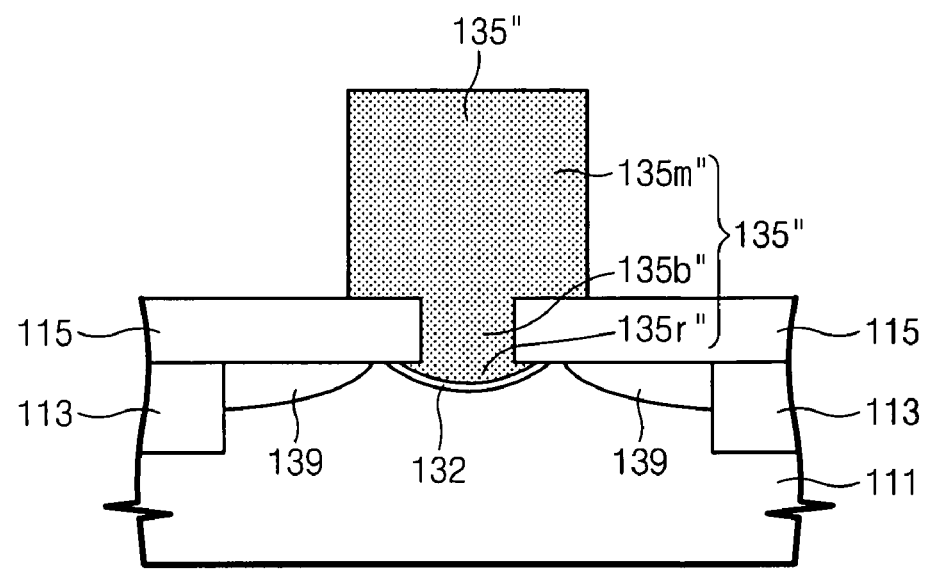

Referring to FIG. 35, the sacrificial nitride layer 117 is removed, thereby exposing the pad oxide layer 115 and the main gate electrode portion portion 135m" of the gate electrode 135". A low concentration impurity-doped region 139 is formed using an ion-implantation process.

Figure 36:
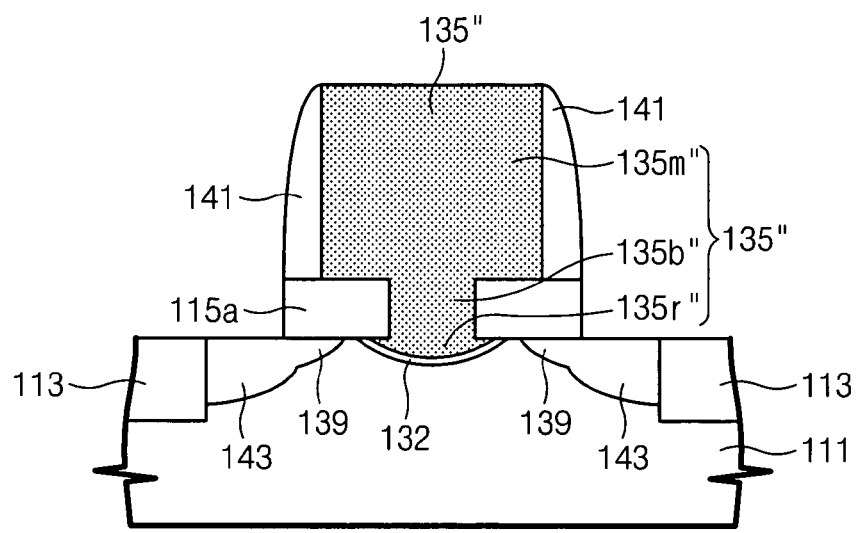

Referring to FIG. 36, a nitride layer is formed on the resultant structure where the low concentration impurity-doped region 139 is formed. The nitride layer is etched back to form a gate insulation spacer 141. An etch back process is performed until the buffer oxide layer 115 is exposed. The exposed buffer oxide layer 115 is etched back to expose the portion of the semiconductor substrate 111 that does not underlie the gate insulation spacer 141, while the buffer oxide 115 remains under the gate insulation spacer 141. A high concentration impurity-doped region 143 is formed by implanting impurity ions at high concentration using the gate insulation spacer 141 as an ion-implantation mask.

The recess part 125r' is shallowly formed. The recess 125 in the embodiments described above with reference to FIGS. 11 through 25 may be likewise shallowly formed, i.e., with a shallow depth of about 50 Å. This will be briefly explained by referring to FIGS. 37 through 40.

Figure 37:
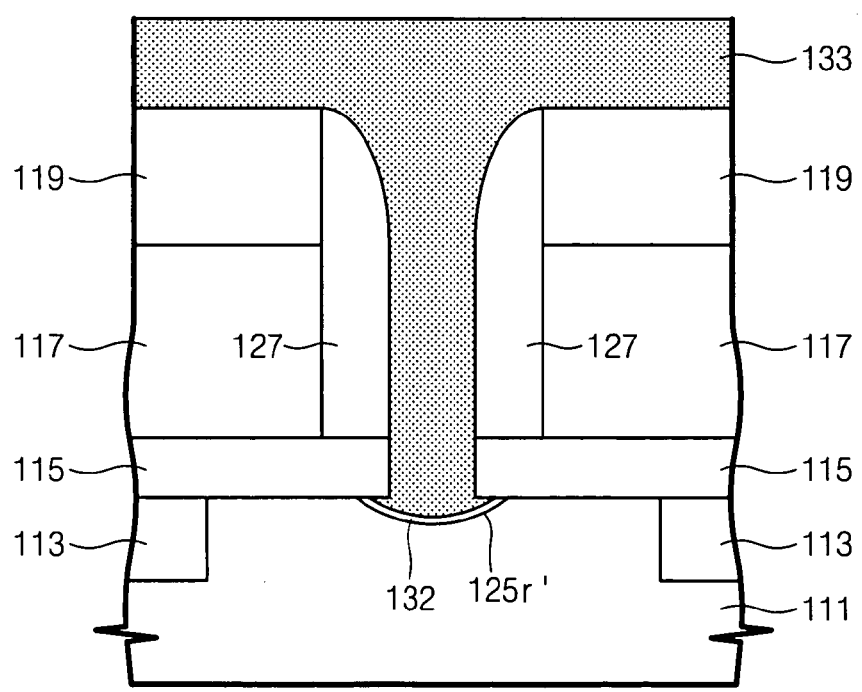
FIGS. 37 through 40 are cross-sectional views showing operations for forming a semiconductor device according to additional embodiments of the present invention.

Referring to FIG. 37, a main gate electrode center portion groove 125mc and a bottom gate electrode groove 125b are formed by using, for example, the operations described above with reference to FIGS. 11, 12A, 13A, 14A and 15. An exposed semiconductor substrate 111 is isotropically etched to form a shallow recess 125r'. The recess 125r' may have a depth of about 50 Å. A thermal oxidation process is then performed to form a gate insulator 132 on the shallow recess 125r'. A gate electrode material 133 is formed on the selective planarization buffer layer 119, thereby filling the recess 125r', the bottom gate electrode groove 125b through the pad oxide layer 115 and the main gate electrode center portion groove 12mc through the sacrificial nitride layer 117.

Figure 38:
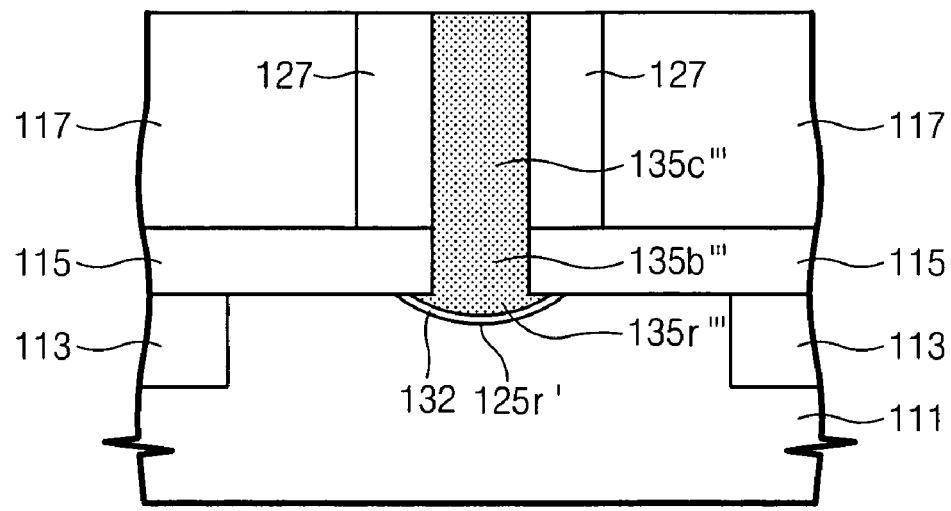

Referring to FIG. 38, a planarization process is performed until the sacrificial nitride layer 117 is exposed, thereby forming a recessed gate electrode portion 135r'" filling the recess 125r', a bottom gate electrode portion 135b'" filling the bottom gate electrode groove 125b and a main gate electrode center portion portion 135c'" filling the main gate electrode center portion 125mc.

Figure 39:
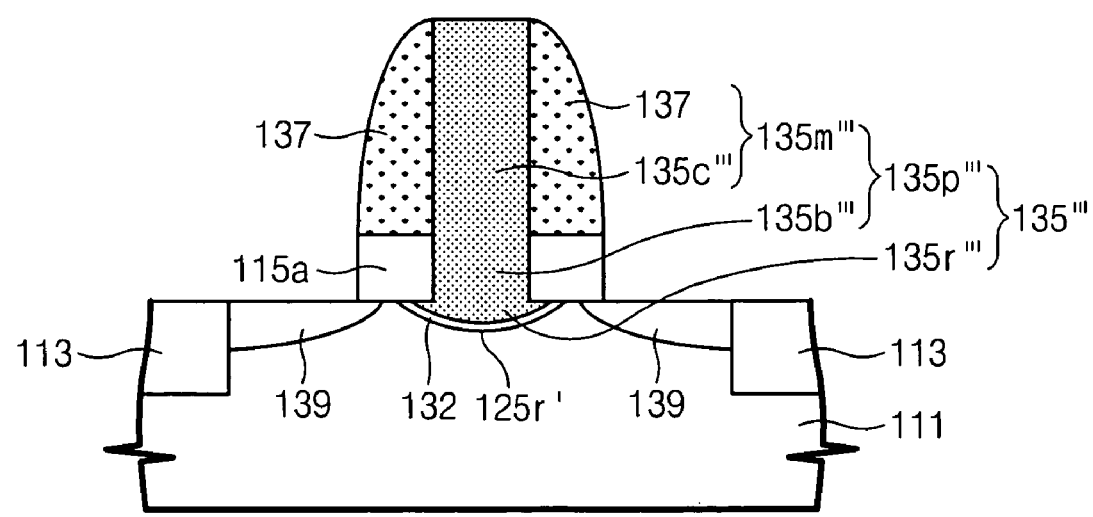

Referring to FIG. 39, the sacrificial nitride layer 117 and the groove spacer 127 are removed to expose the main gate electrode center portion 135c. A silicide spacer 137 is formed on both sidewalls of the exposed main gate electrode center portion 135c. Thus, a gate electrode 135'" is formed. In particular, the main gate electrode center portion 135c'" and the silicide spacer 137 form the main gate electrode portion 135m'", and the bottom gate electrode portion 135b'" and the main gate electrode portion '"135m form a protruding gate electrode portion 135p'". The protruding gate electrode portion 135p'" and the recessed gate electrode portion 135r'" form a gate electrode 135'" having a shape of an anchor.

After forming the silicide spacer 137, the exposed pad oxide layer 115 is etched back, thereby removing the portion of the pad oxide layer 115 that does not underlie the silicide spacer 137 and exposing the semiconductor substrate 111. A portion 115a of the pad oxide layer remains under the silicide spacer 137. A low concentration impurity-doped region 139 is formed in the exposed semiconductor substrate 111 adjacent to the silicide spacer 137 by implanting impurity ions of low concentration, thus forming an LDD region.

Figure 40:
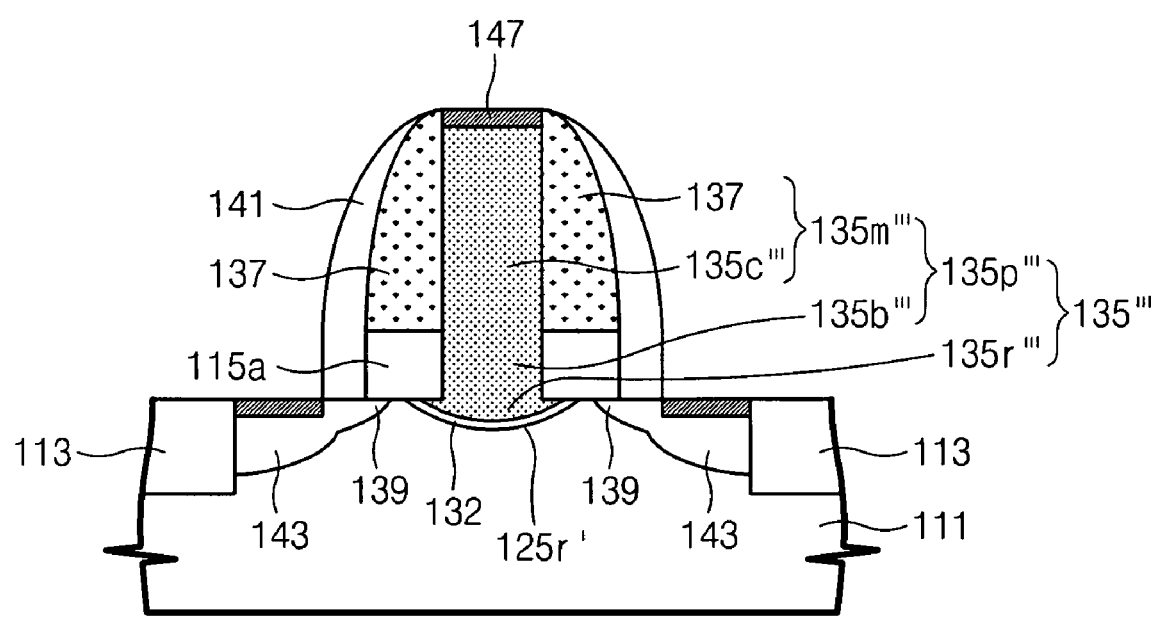

Referring to FIG. 40, a gate insulation spacer 141 is formed on sidewalls of the remaining pad oxide layer 115a and the silicide spacer 137. A high concentration impurity-doped region 143 is formed in the semiconductor substrate 111 adjacent to the gate insulation spacer 141 by implanting impurity ions at a high concentration. The high concentration impurity-doped region 143 and the low concentration doped region 139 serve as source/drain regions.

According to some embodiments of the present invention, a recess is formed in a semiconductor substrate. A thin gate insulator is formed on a bottom of the recess and a thick gate insulator is formed on sidewalls thereof. Thus, parasitic capacitance between the semiconductor substrate and a gate electrode in the recess may be reduced part due to the thick gate insulator on the sidewalls of the recess. Because an effective gate insulator is formed on the bottom of the recess, a semiconductor device having a short channel and exhibiting high speed and/or low power consumption can be provided. Additionally, a silicide layer may be formed on sidewalls of a gate electrode, thereby decreasing a resistance of a semiconductor device.

In the drawings and specification, there have been disclosed typical preferred embodiments of the invention and, although specific terms are employed, they are used in a generic and descriptive sense only and not for purposes of limitation, the scope of the invention being set forth in the following claims.

What is claimed is:

1. A semiconductor device comprising:
   a semiconductor substrate having a recess therein;
   a gate electrode comprising a first portion in the recess and a second reduced-width portion extending from the first portion;
   a source/drain region in the substrate adjacent the recess; and
   a gate insulator interposed between the first portion of the gate electrode and a surface of the recess, the gate insulator comprising a first portion disposed on a sidewall of the recess, in contact with the source/drain region and having a first thickness and a second portion disposed on a bottom of the recess, spaced apart from the source/drain region and having a second thickness less than the first thickness.

2. The semiconductor device of claim 1, further comprising a nitride liner disposed between the first portion of the gate insulator and the recessed portion of the gate electrode.

3. The semiconductor device of claim 1, further comprising:
   an insulation layer on a surface of the substrate adjoining the second portion of the gate electrode above the substrate and extending over a portion of the first portion of the gate electrode; and
   an insulating spacer disposed on a sidewall of the second portion of the gate electrode and on the insulation layer.

4. The semiconductor device of claim 3, wherein the insulation layer comprises silicon oxide and the insulating spacer comprises silicon nitride.

5. The semiconductor device of claim 3, wherein the insulating spacer comprises a first insulating spacer and further comprising a second insulating spacer on sidewalls of the insulation layer and the first insulating spacer.

6. The semiconductor device of claim 5, wherein the source/drain region comprises a lighter-doped portion adjoining the recess.

7. The semiconductor device of claim 1, wherein the gate electrode further comprises a third portion on the second portion, the third portion having a greater width than the second portion.

8. The semiconductor device of claim 7, wherein the source/drain region comprises a lighter-doped portion adjoining the first portion of the gate insulator.

9. The semiconductor device of claim 1, wherein the source/drain region comprises a lighter-doped portion nearer the recess.

10. The semiconductor device of claim 1, wherein the recess has a curved shape.

11. The semiconductor device of claim 10, wherein the recess is hemispherical or elliptical.

12. A semiconductor device comprising:
    a semiconductor substrate having a recess therein;
    a gate insulator on the substrate in the recess;
    a gate electrode comprising a first portion on the gate insulator in the recess, a second reduced-width portion extending from the first portion, and a third portion on the second portion, the third portion having a greater width than the second portion;
    a source/drain region in the substrate adjacent the recess;
    an insulation layer on a surface of the substrate adjoining the second portion of the gate electrode above the substrate and extending over a portion of the first portion of the gate electrode; and
    an insulating spacer disposed on a sidewall of the second portion of the gate electrode, on a sidewall of the third portion of the gate electrode and on the insulation layer.

13. The semiconductor device of claim 12, wherein the insulation layer comprises silicon oxide and the insulating spacer comprises silicon nitride.

14. A semiconductor device comprising:
    a semiconductor substrate having a recess therein;
    a gate electrode comprising a first portion in the recess and a second reduced-width portion extending from the first portion wherein the gate electrode further comprises a third portion on the second portion, the third portion having a greater width than the second portion;
    a source/drain region disposed in the substrate and spaced apart from the recess; and
    a substantially uniform gate insulator layer lining the recess and interposed between the first portion of the gate electrode and a portion of the substrate between the recess and the source/drain region.

15. The semiconductor device of claim 14, further comprising:
    an insulation layer on a surface of the substrate adjoining the second portion of the gate electrode above the substrate and extending over a portion of the first portion of the gate electrode; and
    an insulating spacer disposed on a sidewall of the second portion of the gate electrode, on a sidewall of the third portion of the gate electrode and on the insulation layer.

16. The semiconductor device of claim 15, wherein the insulation layer comprises silicon oxide and the insulating spacer comprises silicon nitride.

17. The semiconductor device of claim 14, wherein the source/drain region comprises a lighter-doped portion nearer the recess.

18. The semiconductor device of claim 14, wherein the recess has a curved shape.

19. The semiconductor device of claim 18, wherein the recess is hemispherical or elliptical.

* * * * *